US012593677B2

(12) United States Patent
Huang

(10) Patent No.: US 12,593,677 B2
(45) Date of Patent: Mar. 31, 2026

(54) SEMICONDUCTOR DEVICE STRUCTURE WITH ENERGY REMOVABLE STRUCTURE AND METHOD FOR PREPARING THE SAME

(71) Applicant: NANYA TECHNOLOGY CORPORATION, New Taipei City (TW)

(72) Inventor: Tse-Yao Huang, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 443 days.

(21) Appl. No.: 18/075,666

(22) Filed: Dec. 6, 2022

(65) Prior Publication Data

US 2024/0186243 A1 Jun. 6, 2024

(51) Int. Cl.
*H10W 20/41* (2026.01)
*H10P 50/00* (2026.01)
*H10W 20/00* (2026.01)
*H10W 20/42* (2026.01)

(52) U.S. Cl.
CPC .......... *H10W 20/435* (2026.01); *H10P 50/73* (2026.01); *H10W 20/056* (2026.01); *H10W 20/076* (2026.01); *H10W 20/083* (2026.01); *H10W 20/42* (2026.01)

(58) Field of Classification Search
CPC ......... H01L 21/31144; H01L 21/76805; H01L 21/76831; H01L 21/76877; H01L 23/5226
See application file for complete search history.

(56) References Cited

U.S. PATENT DOCUMENTS

| | | | |
|---|---|---|---|
| 2021/0305208 A1* | 9/2021 | Huang | .................... H01L 24/27 |
| 2022/0302143 A1 | 9/2022 | Cheng | |
| 2024/0185893 A1* | 6/2024 | Lee | ........................ H10B 41/20 |

FOREIGN PATENT DOCUMENTS

| | | |
|---|---|---|
| TW | 202139408 A | 10/2021 |
| TW | 202220107 A | 5/2022 |

OTHER PUBLICATIONS

Office Action and Search Report mailed on Apr. 17, 2024 related to Taiwanese Application No. 112116630.
Office Action and Search Report mailed on May 13, 2024 related to Taiwanese Application No. 113100926.

* cited by examiner

*Primary Examiner* — Tony Tran
(74) *Attorney, Agent, or Firm* — Xuan Zhang

(57) ABSTRACT

A semiconductor device structure includes a first dielectric layer disposed over a semiconductor substrate, and a first energy removable structure disposed in the first dielectric layer. The semiconductor device structure also includes a second dielectric layer disposed over the first dielectric layer, and an $N^{th}$ dielectric layer disposed over the second dielectric layer. The N is an integer greater than 2. The semiconductor device structure further includes a first conductor disposed in the $N^{th}$ dielectric layer, and an $(N+1)^{th}$ dielectric layer disposed over the $N^{th}$ dielectric layer. A top surface of the first conductor is exposed by a first opening, and a top surface of the first energy removable structure is exposed by a second opening.

15 Claims, 22 Drawing Sheets

10

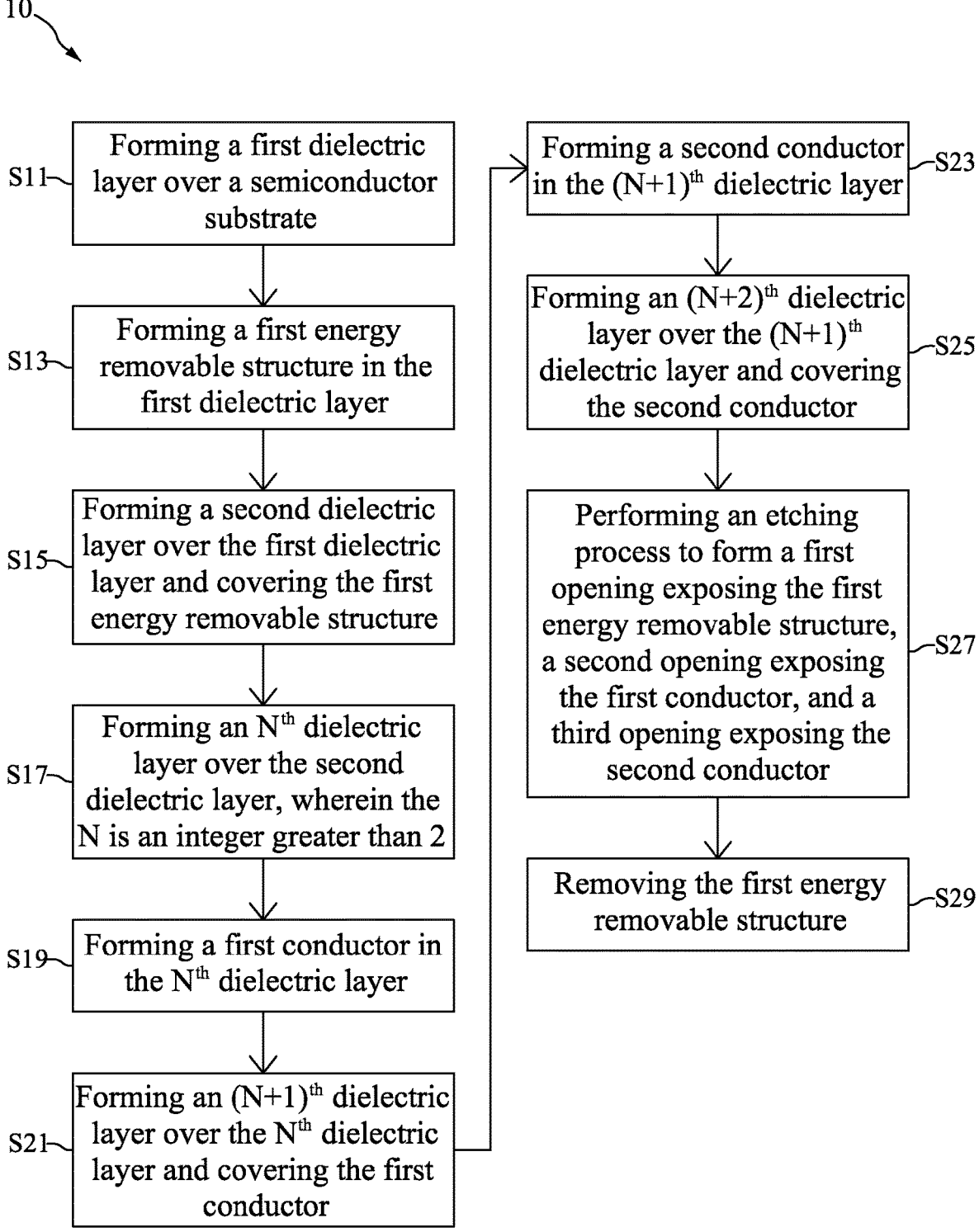

S11 — Forming a first dielectric layer over a semiconductor substrate

S13 — Forming a first energy removable structure in the first dielectric layer

S15 — Forming a second dielectric layer over the first dielectric layer and covering the first energy removable structure S17 — Forming an $N^{th}$ dielectric layer over the second dielectric layer, wherein the N is an integer greater than 2

S19 — Forming a first conductor in the $N^{th}$ dielectric layer

S21 — Forming an $(N+1)^{th}$ dielectric layer over the $N^{th}$ dielectric layer and covering the first conductor S23 — Forming a second conductor in the $(N+1)^{th}$ dielectric layer S25 — Forming an $(N+2)^{th}$ dielectric layer over the $(N+1)^{th}$ dielectric layer and covering the second conductor S27 — Performing an etching process to form a first opening exposing the first energy removable structure, a second opening exposing the first conductor, and a third opening exposing the second conductor S29 — Removing the first energy removable structure

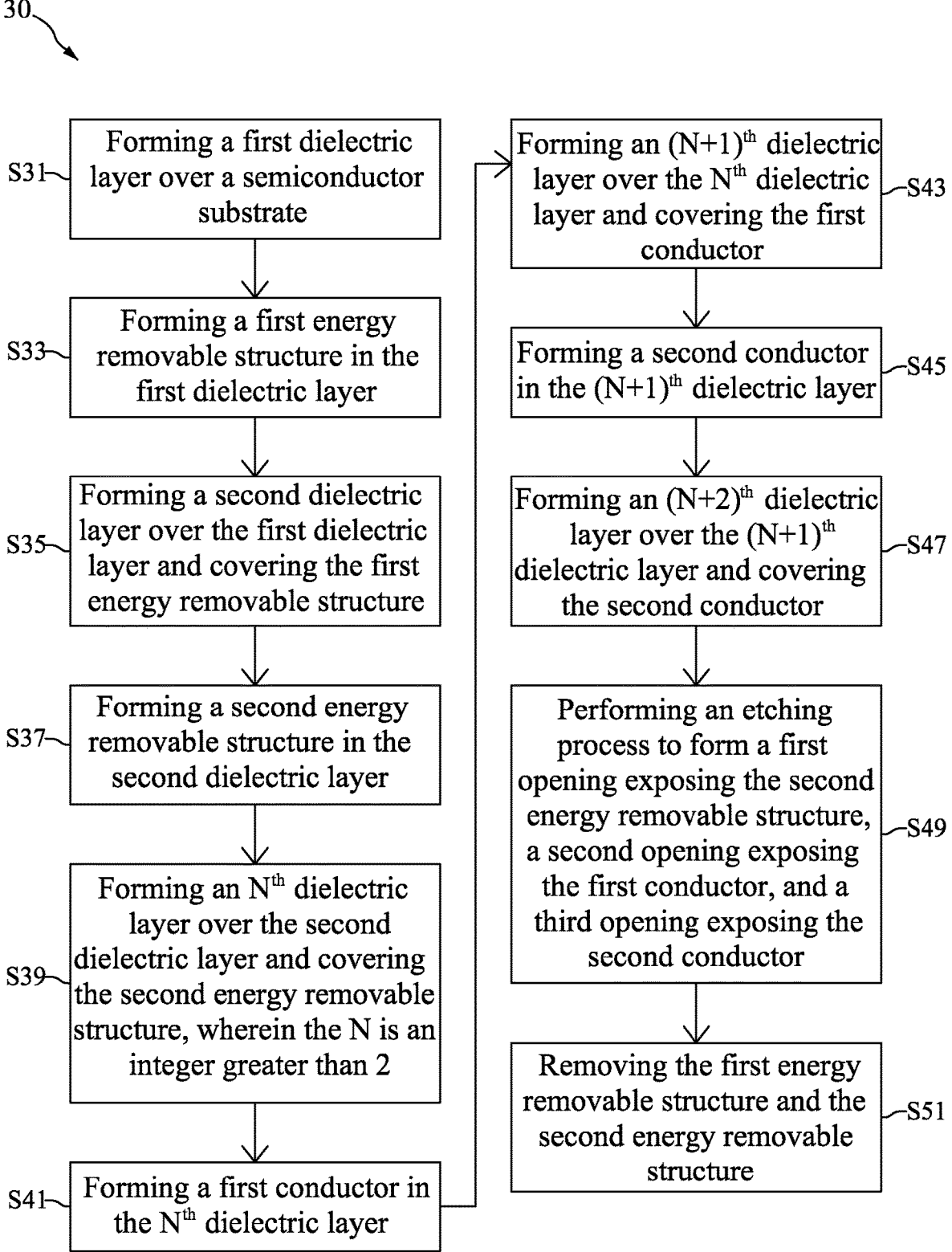

S31 — Forming a first dielectric layer over a semiconductor substrate

S33 — Forming a first energy removable structure in the first dielectric layer

S35 — Forming a second dielectric layer over the first dielectric layer and covering the first energy removable structure S37 — Forming a second energy removable structure in the second dielectric layer S39 — Forming an Nth dielectric layer over the second dielectric layer and covering the second energy removable structure, wherein the N is an integer greater than 2

S41 — Forming a first conductor in the Nth dielectric layer

S43 — Forming an (N+1)th dielectric layer over the Nth dielectric layer and covering the first conductor S45 — Forming a second conductor in the (N+1)th dielectric layer S47 — Forming an (N+2)th dielectric layer over the (N+1)th dielectric layer and covering the second conductor S49 — Performing an etching process to form a first opening exposing the second energy removable structure, a second opening exposing the first conductor, and a third opening exposing the second conductor S51 — Removing the first energy removable structure and the second energy removable structure

FIG. 5

SEMICONDUCTOR DEVICE STRUCTURE WITH ENERGY REMOVABLE STRUCTURE AND METHOD FOR PREPARING THE SAME

TECHNICAL FIELD

The present disclosure relates to a semiconductor device structure and a method for preparing the same, and more particularly, to a semiconductor device structure with an energy removable structure and a method for preparing the same.

Discussion of the Background

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first dielectric layer disposed over a semiconductor substrate, and a first energy removable structure disposed in the first dielectric layer. The semiconductor device structure also includes a second dielectric layer disposed over the first dielectric layer, and an $N^{th}$ dielectric layer disposed over the second dielectric layer. The N is an integer greater than 2. The semiconductor device structure further includes a first conductor disposed in the $N^{th}$ dielectric layer, and an $(N+1)^{th}$ dielectric layer disposed over the $N^{th}$ dielectric layer. A top surface of the first conductor is exposed by a first opening, and a top surface of the first energy removable structure is exposed by a second opening.

In an embodiment, the first energy removable structure penetrates through the first dielectric layer. In an embodiment, a bottom surface of the first conductor is higher than a bottom surface of the $N^{th}$ dielectric layer. In an embodiment, the first conductor is in direct contact with the $(N+1)^{th}$ dielectric layer. In an embodiment, the semiconductor device structure further includes a second conductor disposed in the $(N+1)^{th}$ dielectric layer. In an embodiment, the semiconductor device structure further includes an $(N+2)^{th}$ dielectric layer disposed over the $(N+1)^{th}$ dielectric layer, wherein a top surface of the second conductor is exposed by a third opening. In an embodiment, a bottom surface of the second conductor is higher than a bottom surface of the $(N+1)^{th}$ dielectric layer.

In another embodiment of the present disclosure, a semiconductor device structure is provided. The semiconductor device structure includes a first dielectric layer disposed over a semiconductor substrate, and a first energy removable structure disposed in the first dielectric layer. The semiconductor device structure also includes a second dielectric layer disposed over the first dielectric layer, and a second energy removable structure disposed in the second dielectric layer. The semiconductor device structure further includes an $N^{th}$ dielectric layer disposed over the second dielectric layer. The N is an integer greater than 2. In addition, the semiconductor device structure includes a first conductor disposed in the $N^{th}$ dielectric layer, and an $(N+1)^{th}$ dielectric layer disposed over the $N^{th}$ dielectric layer. A top surface of the first conductor is exposed by a first opening, and a top surface of the second energy removable structure is exposed by a second opening.

In an embodiment, the second energy removable structure is directly over the first energy removable structure. In an embodiment, the second energy removable structure penetrates through the second dielectric layer to directly contact the first energy removable structure. In an embodiment, the first energy removable structure penetrates through the first dielectric layer. In an embodiment, a bottom surface of the first conductor is higher than the top surface of the second energy removable structure. In an embodiment, the top surface of the first conductor is substantially coplanar with a bottom surface of the $(N+1)^{th}$ dielectric layer. In an embodiment, the semiconductor device structure further includes a second conductor disposed in the $(N+1)^{th}$ dielectric layer, and a bottom surface of the second conductor is higher than the top surface of the first conductor. In an embodiment, the semiconductor device structure further includes an $(N+2)^{th}$ dielectric layer disposed over the $(N+1)^{th}$ dielectric layer, wherein a top surface of the second conductor is exposed by a third opening.

In yet another embodiment of the present disclosure, a method for preparing a semiconductor device structure is provided. The method includes forming a first dielectric layer over a semiconductor substrate, and forming a first energy removable structure in the first dielectric layer. The method also includes forming a second dielectric layer over the first dielectric layer and covering the first energy removable structure, and forming an $N^{th}$ dielectric layer over the second dielectric layer. The N is an integer greater than 2. The method further includes forming a first conductor in the $N^{th}$ dielectric layer, and forming an $(N+1)^{th}$ dielectric layer over the $N^{th}$ dielectric layer and covering the first conductor. In addition, the method includes performing an etching process to form a first opening exposing the first conductor and a second opening directly over the first energy removable structure. A bottom surface of the first opening is higher than a bottom surface of the second opening.

In an embodiment, a top surface of the first conductor is exposed by the first opening. In an embodiment, the method further includes forming a second conductor in the $(N+1)^{th}$ dielectric layer, forming an $(N+2)^{th}$ dielectric layer over the $(N+1)^{th}$ dielectric layer and covering the second conductor, and performing the etching process to form a third opening exposing the second conductor. In an embodiment, a bottom surface of the third opening is higher than the bottom surface of the first opening. In an embodiment, a top surface of the second conductor is exposed by the third opening. In an embodiment, a bottom surface of the second conductor is higher than the bottom surface of the first opening.

In an embodiment, a top surface of the first energy removable structure is exposed by the second opening, and the first energy removable structure is removed after the etching process is performed. In an embodiment, the forming the first energy removable structure includes forming a fourth opening penetrating through the first dielectric layer, and filling the fourth opening with the first energy removable structure. In an embodiment, the method further includes forming a second energy removable structure in the second dielectric layer before the $N^{th}$ dielectric layer is formed, wherein a top surface of the second energy removable structure is exposed by the second opening. In an embodiment, the forming the second energy removable structure includes forming a fifth opening penetrating through the second dielectric layer to expose a top surface of the first energy removable structure, and filling the fifth opening with the second energy removable structure. In an embodiment, the first energy removable structure and the second energy removable structure are removed after the etching process is performed.

Embodiments of a semiconductor device structure and method for preparing the same are provided in the disclosure. In some embodiments, the semiconductor device structure includes multiple stacked dielectric layers, and a conductor and an energy removable structure disposed in different levels of the dielectric layers. In some embodiments, the energy removable structure is exposed by an opening deeper than the one exposing the conductor, and the two openings are formed simultaneously by etching. Since the energy removable structure is used as an etch stop for the etching of the opening with a high aspect ratio, and the energy removable structure can be easily removed after the etching process, the aspect ratio difference between the two openings can be reduced (compared to the case where the energy removable structure is not formed). As a result, the performance, reliability and yield of the semiconductor device structure can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 4 is a flow diagram illustrating a method for preparing a semiconductor device structure, in accordance with some embodiments.

FIG. 5 is a flow diagram illustrating a method for preparing a semiconductor device structure, in accordance with some other embodiments.

FIG. 16 is a cross-sectional view illustrating an intermediate stage of forming an $(N+2)^{th}$ dielectric layer over the $(N+1)^{th}$ dielectric layer and covering the second conductor during the formation of the semiconductor device structure, in accordance with some embodiments.

Figure 17:
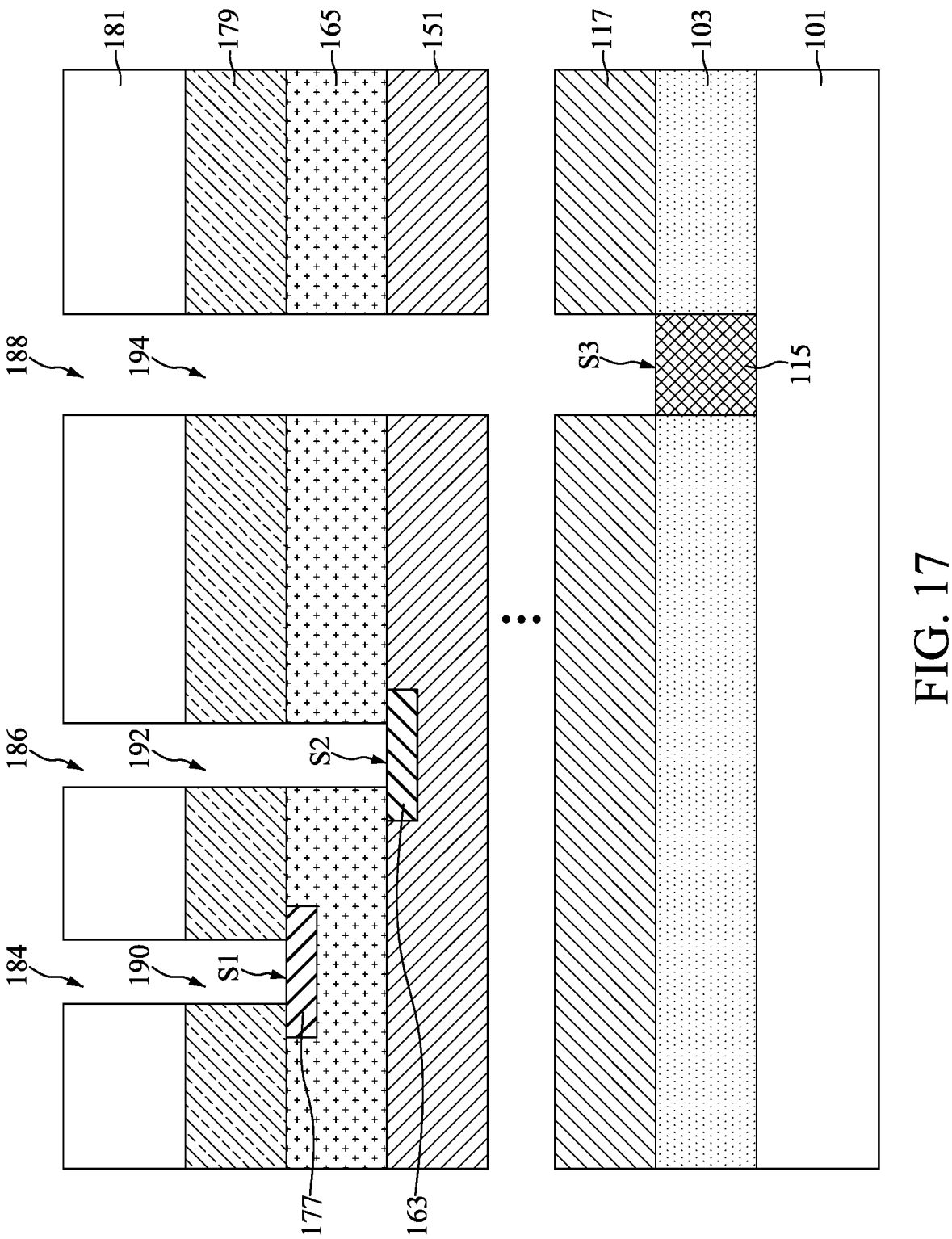

FIG. 17 is a cross-sectional view illustrating an intermediate stage of performing an etching process to form a plurality of openings respectively exposing top surfaces of the first conductor, the second conductor, and the first energy removable structure during the formation of the semiconductor device structure, in accordance with some embodiments.

Figure 18:
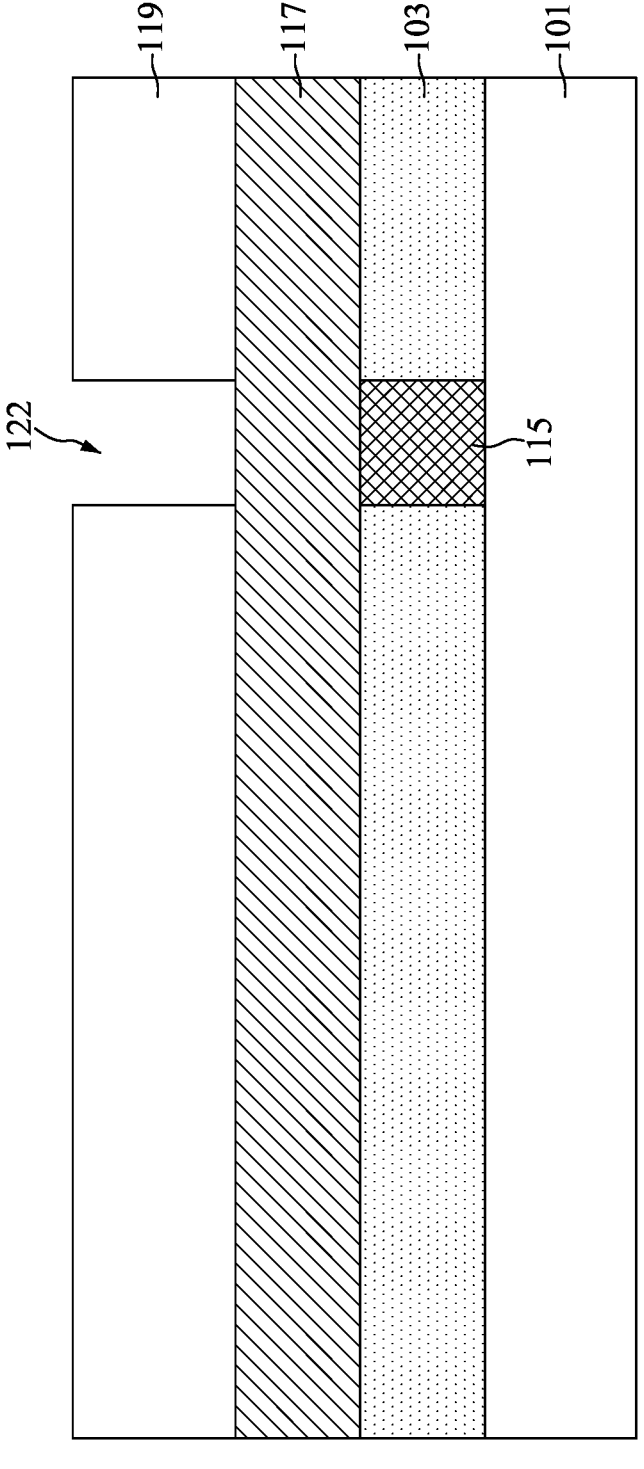

FIG. 18 is a cross-sectional view illustrating an intermediate stage of forming a second dielectric layer over the first dielectric layer and covering the first energy removable structure during the formation of the semiconductor device structure, in accordance with some embodiments.

Figure 19:
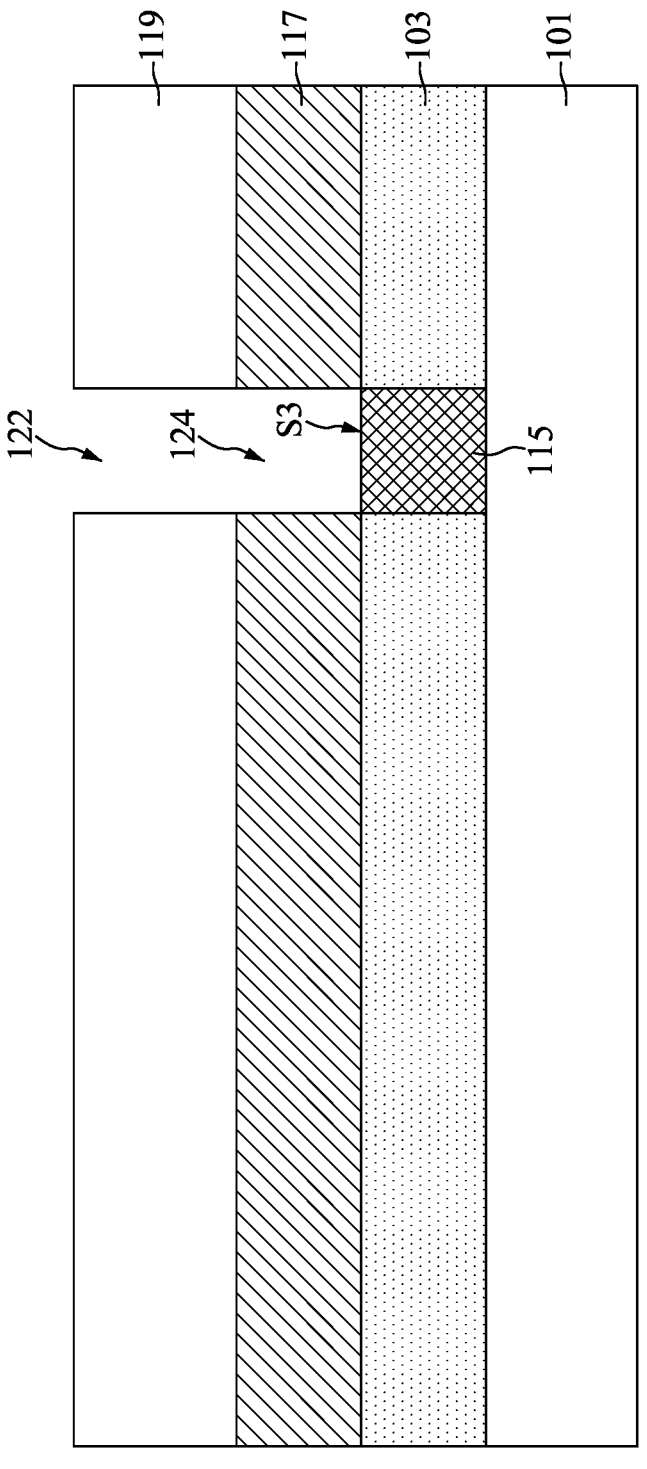

FIG. 19 is a cross-sectional view illustrating an intermediate stage of forming an opening in the second dielectric layer to expose a top surface of the first energy removable structure during the formation of the semiconductor device structure, in accordance with some embodiments.

Figure 20:
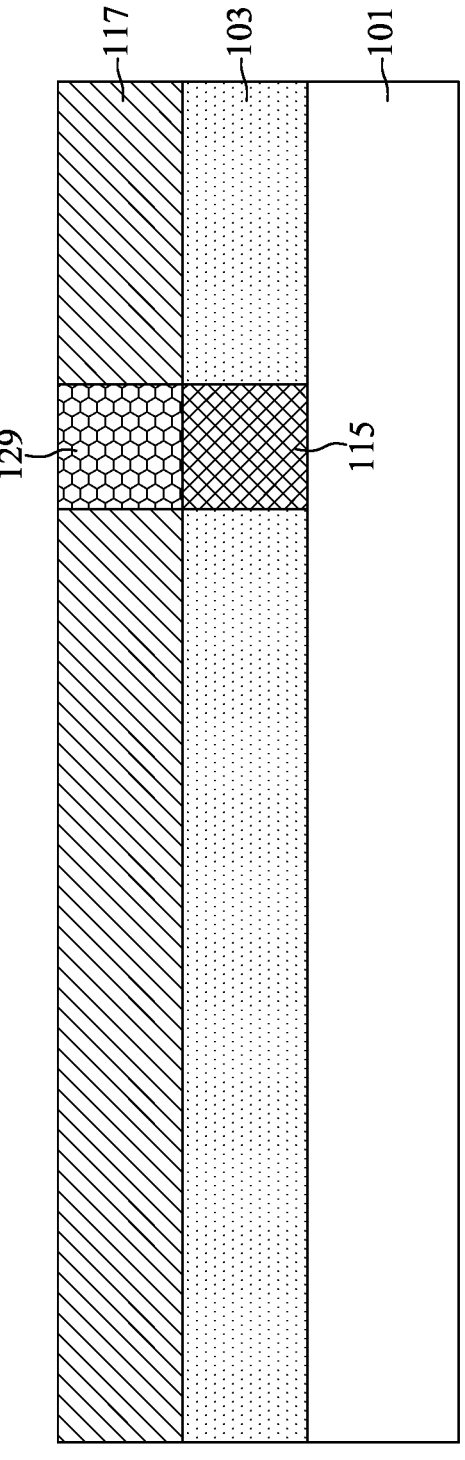

FIG. 20 is a cross-sectional view illustrating an intermediate stage of filling the opening in the second dielectric layer with a second energy removable structure during the formation of the semiconductor device structure, in accordance with some embodiments.

Figure 21:
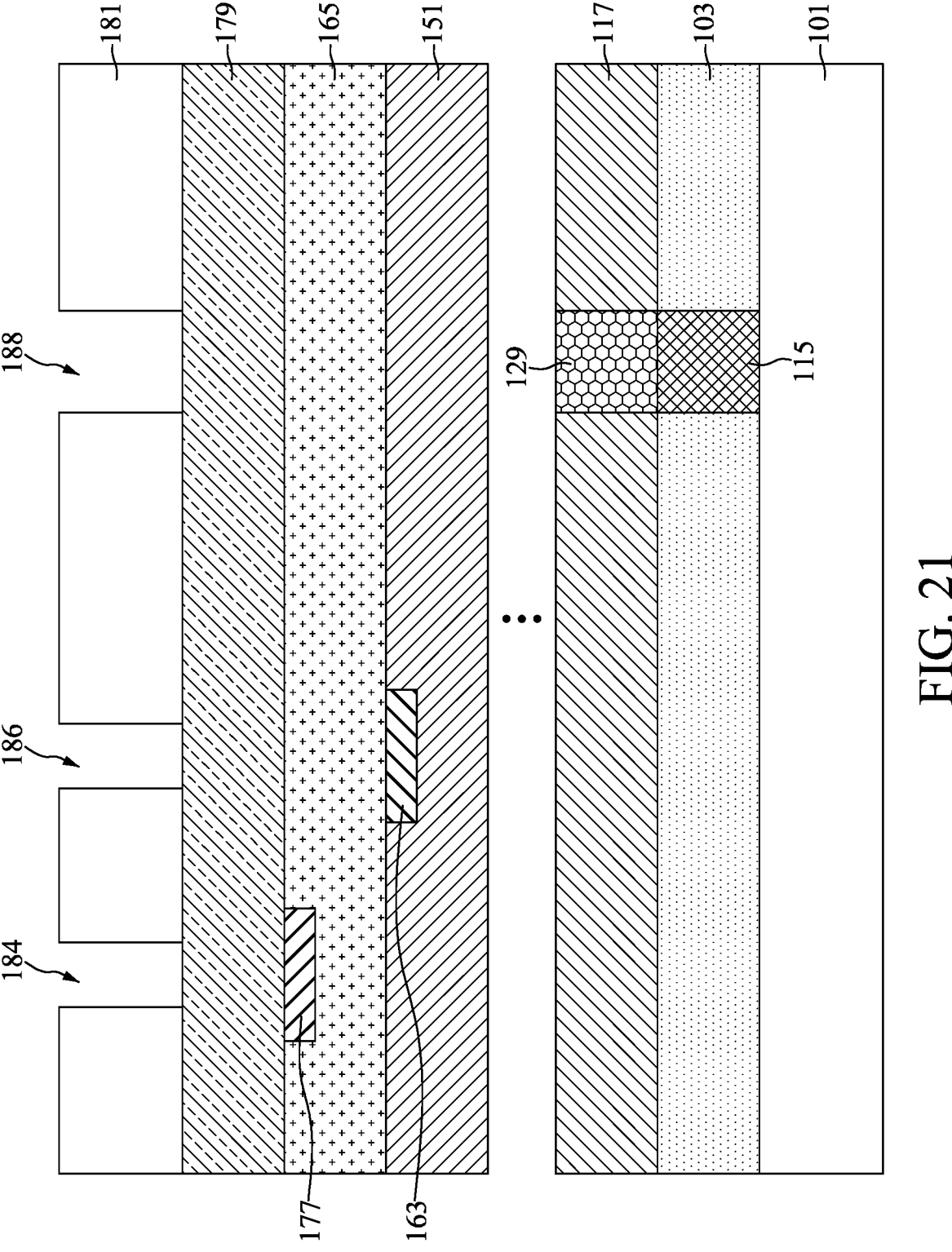

FIG. 21 is a cross-sectional view illustrating an intermediate stage of forming a plurality of dielectric layers over the second dielectric layer and forming a first conductor and a second conductor in different levels of the plurality of dielectric layers during the formation of the semiconductor device structure, in accordance with some embodiments.

Figure 22:
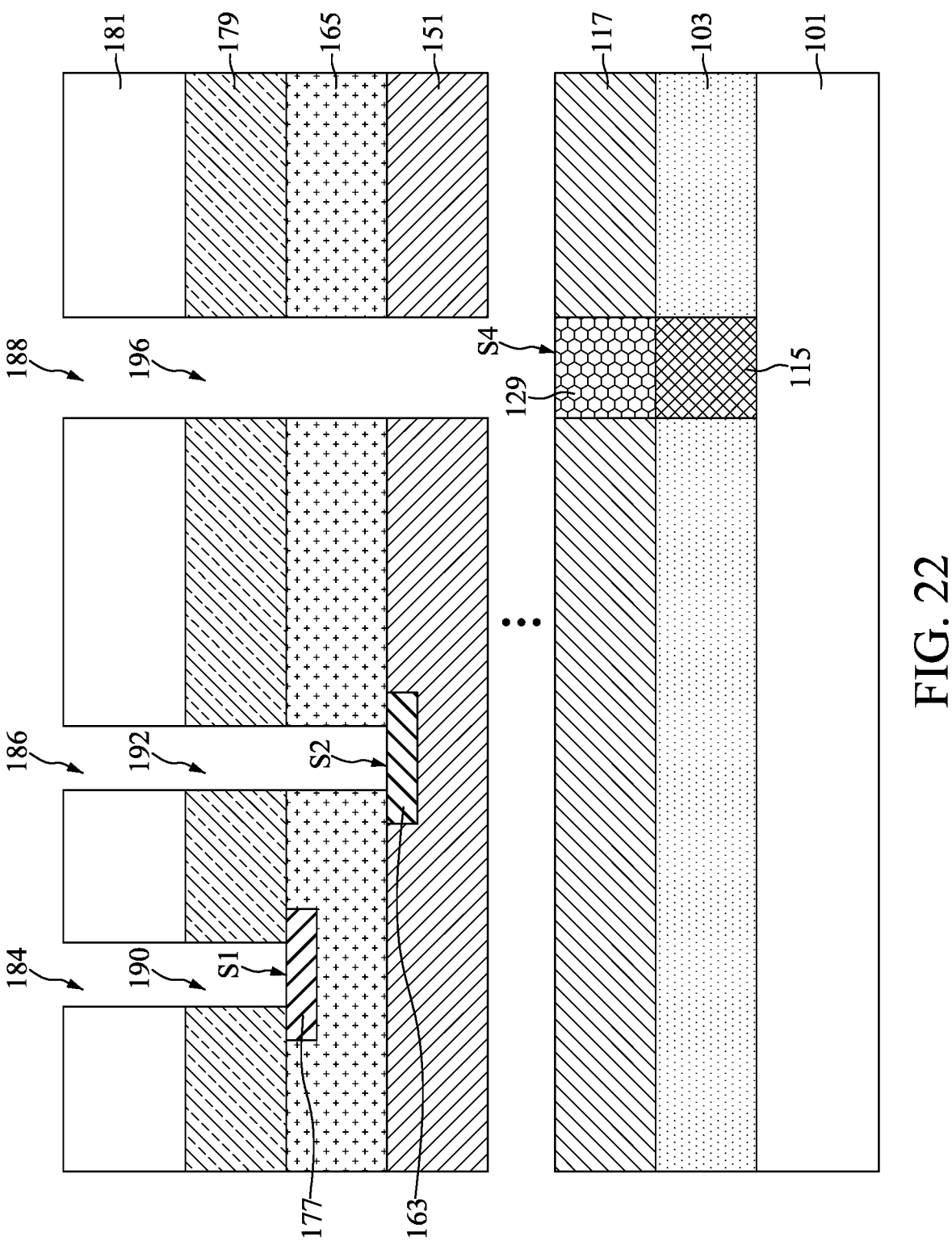

FIG. 22 is a cross-sectional view illustrating an intermediate stage of performing an etching process to form a plurality of openings respectively exposing top surfaces of the first conductor, the second conductor, and the second energy removable structure during the formation of the semiconductor device structure, in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
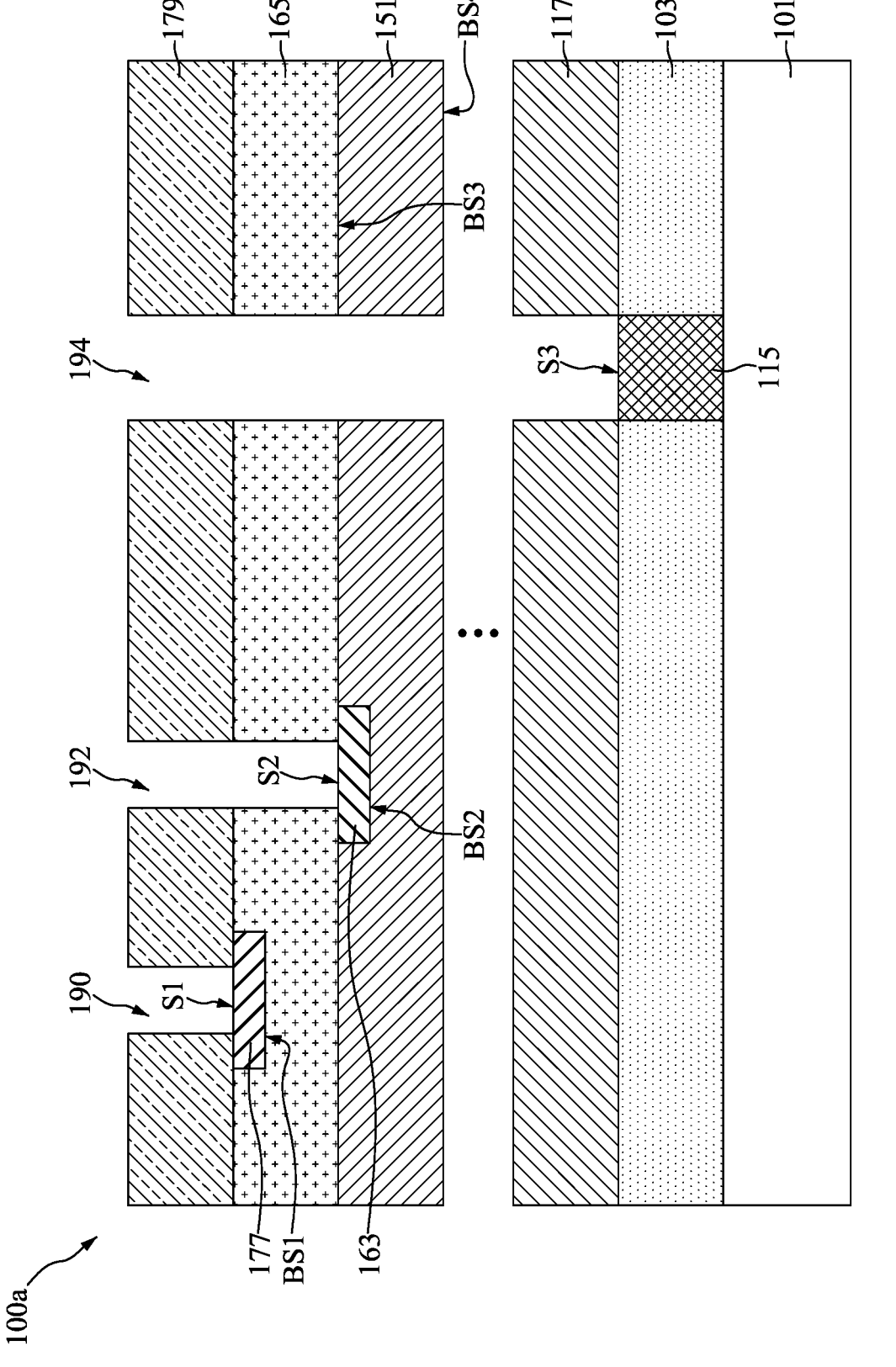
FIG. 1 is a cross-sectional view illustrating a semiconductor device structure, in accordance with some embodiments.

FIG. 1 is a cross-sectional view illustrating a semiconductor device structure 100a, in accordance with some embodiments. As shown in FIG. 1, the semiconductor device structure 100a includes a semiconductor substrate 101, and a plurality of dielectric layers disposed over the semiconductor substrate 101, in accordance with some embodiments. In some embodiments, the plurality of the dielectric layers number from 1 to N+2, with the first dielectric layer 103 being the nearest dielectric layer to the semiconductor substrate 101, and the $(N+2)^{th}$ dielectric layer 179 being the furthest dielectric layer from the semiconductor substrate 101. In some embodiments, the N is an integer greater than 2.

For example, as shown in FIG. 1, the semiconductor device structure 100a includes a first dielectric layer 103 disposed over the semiconductor substrate 101, a second dielectric layer 117 disposed over the first dielectric layer 103, an $N^{th}$ dielectric layer 151 disposed over the second dielectric layer, an $(N+1)^{th}$ dielectric layer 165 disposed over the $N^{th}$ dielectric layer 151, and an $(N+2)^{th}$ dielectric layer 179 disposed over the $(N+1)^{th}$ dielectric layer 165, and the N is an integer greater than 2, in accordance with some embodiments.

If N is equal to 3, the $N^{th}$ dielectric layer 151 will be the third dielectric layer 151, and the third dielectric layer 151 is in direct contact with the second dielectric layer 117 (i.e., no dielectric layer disposed between the second dielectric layer 117 and the third dielectric layer 151). If N is equal to 4, the $N^{th}$ dielectric layer 151 will be the fourth dielectric layer 151. Although not shown, a third dielectric layer may be sandwiched between the second dielectric layer 117 and the fourth dielectric layer 151, in accordance with some embodiments. If N is a number greater than 4, there will be more dielectric layers present, and so on.

In some embodiments, the semiconductor device structure 100a includes a first energy removable structure 115 disposed in the first dielectric layer 103. In some embodiments, the first energy removable structure 115 penetrates through the first dielectric layer 103. In some embodiments, the first energy removable structure 115 is in direct contact with the semiconductor substrate 101. In some embodiments, the first energy removable structure 115 is surrounded by and in direct contact with the first dielectric layer 103.

Moreover, in some embodiments, the semiconductor device structure 100a includes a first conductor 163 disposed in the $N^{th}$ dielectric layer 151, and a second conductor 177 disposed in the $(N+1)^{th}$ dielectric layer 165. In some embodiments, the bottom surface BS1 of the second conductor 177 is higher than the bottom surface BS3 of the $(N+1)^{th}$ dielectric layer 165, and the bottom surface BS2 of the first conductor 163 is higher than the bottom surface BS4 of the $N^{th}$ dielectric layer 151. In other words, the second conductor 177 does not penetrate through the $(N+1)^{th}$ dielectric layer 165, and the first conductor 163 does not penetrates through the $N^{th}$ dielectric layer 151, in accordance with some embodiments.

In some embodiments, the first energy removable structure 115, the first conductor 163, and the second conductor 177 are respectively exposed by openings 194, 192, and 190. In some embodiments, the top surface S3 of the first energy removable structure 115 is exposed by the opening 194, the top surface S2 of the first conductor 163 is exposed by the opening 192, and the top surface S1 of the second conductor 177 is exposed by the opening 190.

The top surface S1 of the second conductor 177 is also referred to as the bottom surface of the opening 190, the top surface S2 of the first conductor 163 is also referred to as the bottom surface of the opening 192, and the top surface S3 of the first energy removable structure 115 is also referred to as the bottom surface of the opening 194. In some embodiments, the bottom surface S1 of the opening 190 is higher than the bottom surface S2 of the opening 192, and the bottom surface S2 of the opening 192 is higher than the bottom surface S3 of the opening 194. Still referring to FIG. 1, the opening 190 penetrates through the $(N+2)^{th}$ dielectric layer 179, the opening 192 penetrates through the $(N+2)^{th}$ dielectric layer 179 and the $(N+1)^{th}$ dielectric layer 165, and the opening 194 penetrates through the $(N+2)^{th}$ dielectric layer 179, the $(N+1)^{th}$ dielectric layer 165, the $N^{th}$ dielectric layer 151, the second dielectric layer 117, and the dielectric layer(s) between the $N^{th}$ dielectric layer 151 and the second dielectric layer 117, if any.

In some embodiments, the openings 190, 192, and 194 are formed by an etching process, the opening 194 has an aspect ratio higher than that of the openings 190 and 192, and the first energy removable structure 115, the first conductor 163, and the second conductor 177 are used as etch stops for the etching process. After the etching process is performed, the first energy removable structure 115 can be easily removed.

By using the first energy removable structure 115 as an etch stop for forming the opening 194 (i.e., the opening with a higher aspect ratio), the aspect ratio differences between the opening 194 and the openings 190 and 192 can be reduced (compared to the case where the first energy removable structure 115 is not formed). As a result, the etching process for forming the openings 190, 192, and 194 can be performed easily, and the performance, reliability and yield of the semiconductor device structure 100a can be improved.

Figure 2:
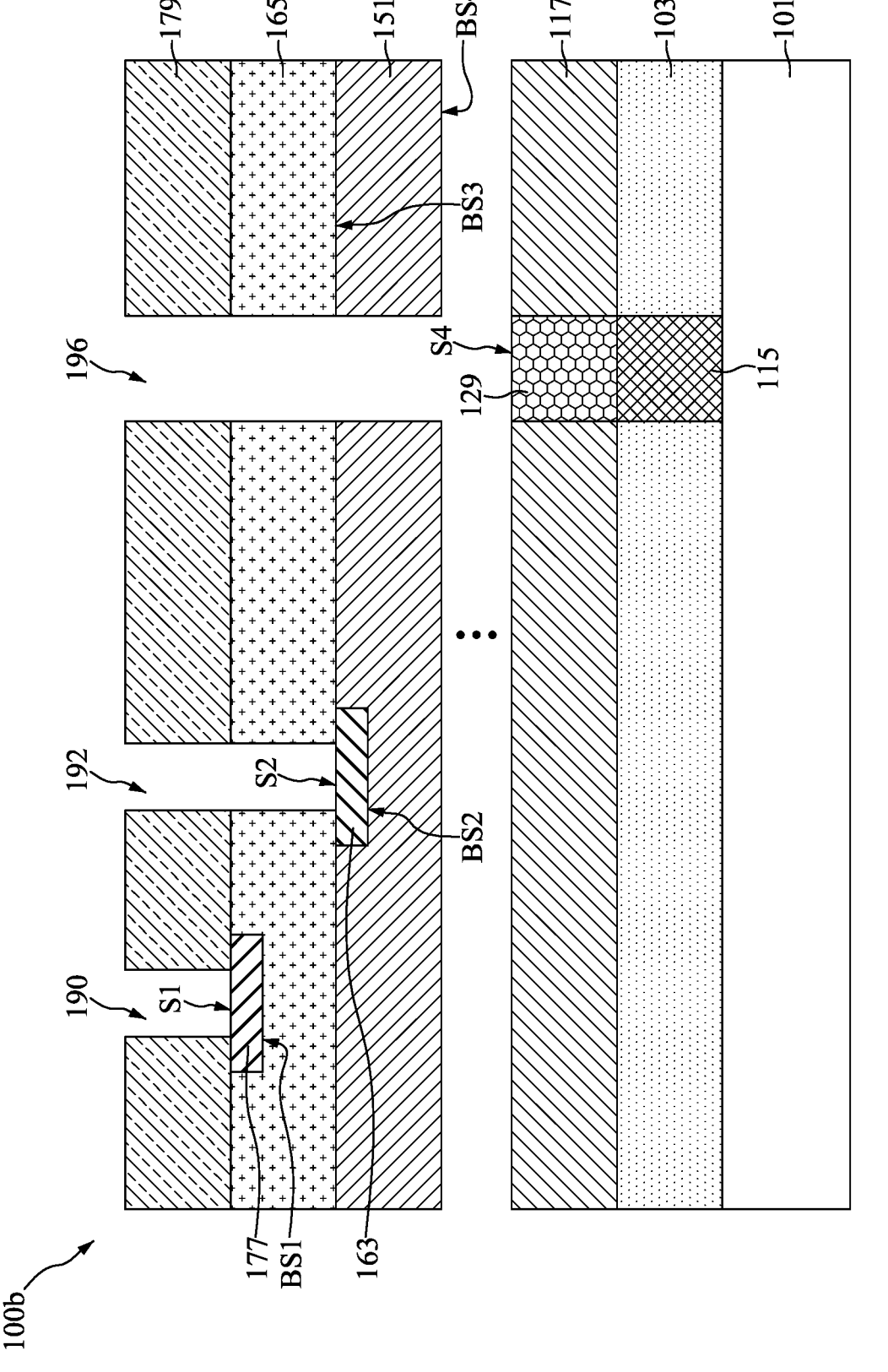
FIG. 2 is a cross-sectional view illustrating a semiconductor device structure, in accordance with some other embodiments.

FIG. 2 is a cross-sectional view illustrating a semiconductor device structure 100b, in accordance with some other embodiments. The semiconductor device structure 100b is similar to the semiconductor device structure 100a. However, in the semiconductor device structure 100b, a second energy removable structure 129 is disposed in the second dielectric layer 117 and over the first energy removable structure 115, and the second energy removable structure 129 is exposed by an opening 196 rather than the opening 194 described in FIG. 1, in accordance with some embodiments.

In some embodiments, the second energy removable structure 129 is directly over and substantially aligned with the first energy removable structure 115. Within the context of this disclosure, the word "substantially" means preferably at least 90%, more preferably 95%, even more preferably 98%, and most preferably 99%. In some embodiments, the second energy removable structure 129 penetrates through the second dielectric layer 117 to directly contact the first energy removable structure 115. In some embodiments, the second energy removable structure 129 is surrounded by and in direct contact with the second dielectric layer 117.

In some embodiments, the top surface S4 of the second energy removable structure 129 is exposed by the opening 196. The top surface S4 of the second energy removable structure 129 is also referred to as the bottom surface of the opening 196. In some embodiments, the bottom surface S1 of the opening 190 is higher than the bottom surface S2 of the opening 192, and the bottom surface S2 of the opening 192 is higher than the bottom surface S4 of the opening 196. In some embodiments, the opening 196 penetrates through the $(N+2)^{th}$ dielectric layer 179, the $(N+1)^{th}$ dielectric layer 165, the $N^{th}$ dielectric layer 151, and the dielectric layer(s) between the $N^{th}$ dielectric layer 151 and the second dielectric layer 117, if any.

In some embodiments, the openings 190, 192, and 196 are formed by an etching process, the opening 196 has an aspect ratio higher than that of the openings 190 and 192, and the second energy removable structure 129, the first conductor 163, and the second conductor 177 are used as etch stops for the etching process. After the etching process is performed, the second energy removable structure 129 and the first energy removable structure 115 can be easily removed. The formation of the first energy removable structure 115 and the second energy removable structure 129 can help to reduce the aspect ratio differences between the opening 196 and the openings 190 and 192 (compared to the case where the first energy removable structure 115 and the second energy removable structure 129 are not formed). As a result, the etching process can be performed easily, and the performance, reliability and yield of the semiconductor device structure 100b can be improved.

Figure 3:
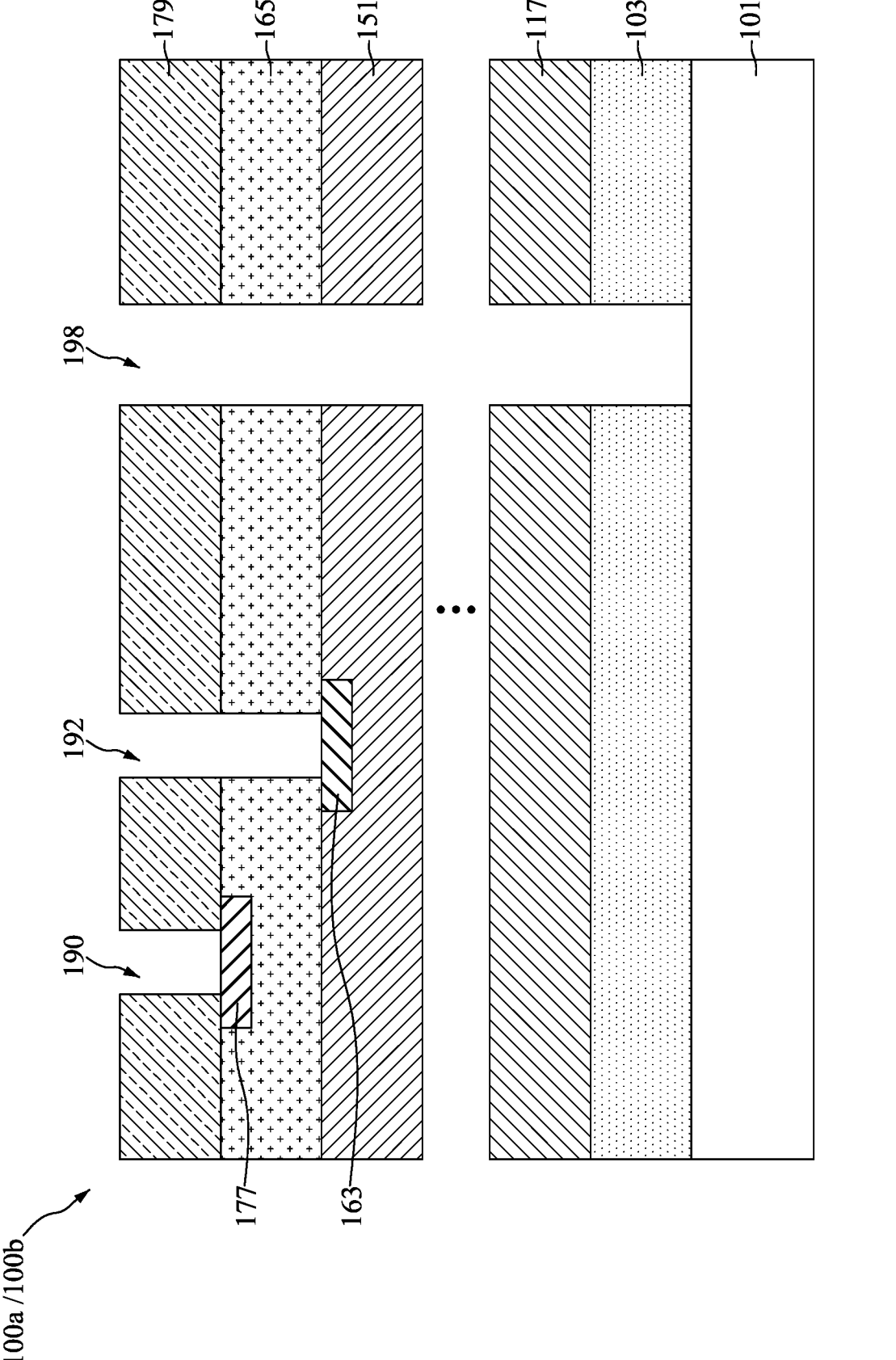
FIG. 3 is a cross-sectional view illustrating the semiconductor device structure after removing the energy removable structure(s), in accordance with some embodiments.

FIG. 3 is a cross-sectional view illustrating the semiconductor device structure 100a or the semiconductor device structure 100b after removing the energy removable structure(s), in accordance with some embodiments. As mentioned above, a removal process may be performed on the first energy removable structure 115 after the semiconductor device structure 100a is obtained. For example, the removal process includes a heat treatment process, and the temperature used in the heat treatment process is high enough to efficiently burn-out the first energy removable structure 115, thereby deepening the opening 194, referred to as an opening 198 shown in FIG. 3.

The removal process for the first energy removable structure 115 is not limited to the heat treatment process. In some embodiments, the removal process includes a light treatment process, an e-beam treatment process, a combination thereof, or another suitable energy treatment process. After the first energy removable structure 115 is removed, additional cleaning process may be used to ensure no undesired residue remains in the openings 190, 192, and 198.

Similar to the semiconductor device structure 100a, a removal process may be performed on the second energy removable structure 129 and first energy removable structure 115 after the semiconductor device structure 100b is obtained. For example, the removal process includes a heat treatment process, and the temperature used in the heat treatment process is high enough to efficiently burn-out the second energy removable structure 129 and the first energy removable structure 115, thereby deepening the opening 196, referred to as an opening 198 shown in FIG. 3. The removal process for the second energy removable structure 129 and the first energy removable structure 115 is not limited to the heat treatment process. In some embodiments, the removal process includes a light treatment process, an e-beam treatment process, a combination thereof, or another suitable energy treatment process. After the first energy removable structure 115 and the second energy removable structure 129 are removed, additional cleaning process may be used to ensure no undesired residue remains in the opening 190, 192, and 198.

FIG. 4 is a flow diagram illustrating a method 10 for preparing the semiconductor device structure 100a, and the method 10 includes steps S11, S13, S15, S17, S19, S21, S23, S25, S27 and S29, in accordance with some embodiments. The steps S11 to S29 of FIG. 4 are elaborated in connection with the following figures, such as FIGS. 6-17.

FIG. 5 is a flow diagram illustrating a method 30 for preparing the semiconductor device structure 100b, and the method 30 includes steps S31, S33, S35, S37, S39, S41, S43, S45, S47, S49 and S51, in accordance with some embodiments. The steps S31 to S51 of FIG. 5 are elaborated in connection with the following figures, such as FIGS. 18-22.

Figure 6:
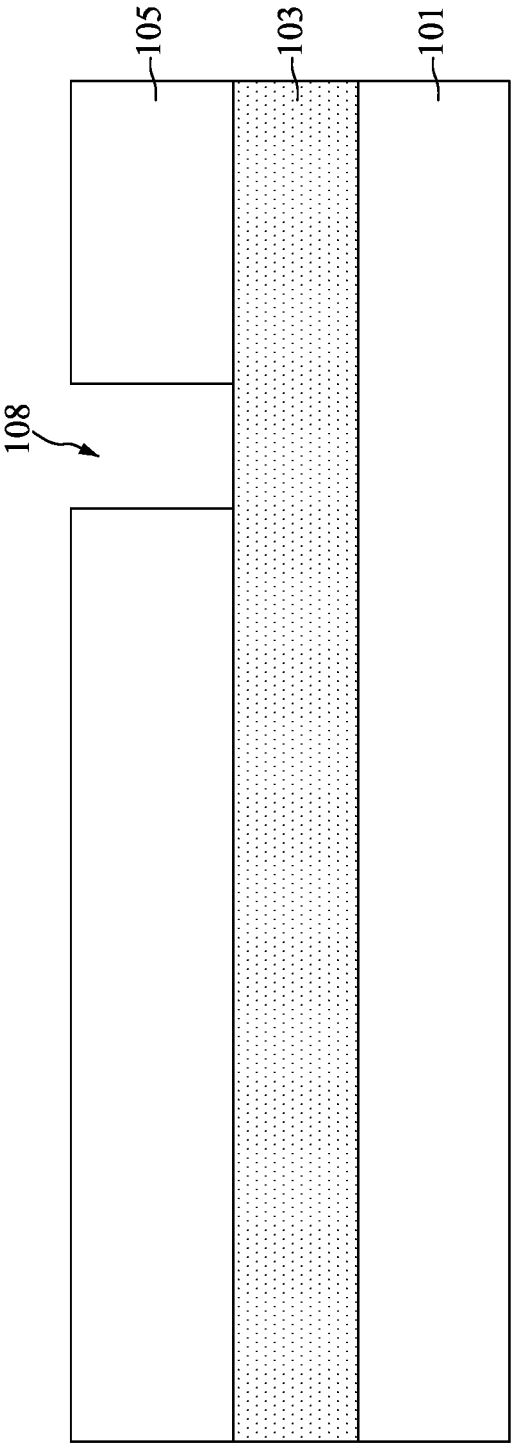
FIG. 6 is a cross-sectional view illustrating an intermediate stage of forming a first dielectric layer over a semiconductor substrate during the formation of the semiconductor device structure, in accordance with some embodiments.

FIGS. 6-17 are cross-sectional views illustrating intermediate stages of forming the semiconductor device structure 100a, in accordance with some embodiments. As shown in FIG. 6, a semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A first dielectric layer 103 is formed over the semiconductor substrate 101, as shown in FIG. 6 in accordance with some embodiments. The respective step is illustrated as the step S11 in the method 10 shown in FIG. 4. In some embodiments, the first dielectric layer 103 is made of silicon oxide, silicon nitride, silicon oxynitride, a low-k dielectric material or another suitable material. The first dielectric layer 103 may be formed by a deposition process, such as a chemical vapor deposition (CVD) process, a physical vapor deposition (PVD) process, an atomic layer deposition (ALD) process, a spin-on coating process, or another suitable method.

Then, still referring to FIG. 6, a patterned mask 105 with an opening 108 is formed over the first dielectric layer 103. In some embodiments, the first dielectric layer 103 is partially exposed by the opening 108. In some embodiments, the first dielectric layer 103 and the patterned mask 105 include different materials so that the etching selectivities may be different in the subsequent etching process.

Figure 7:
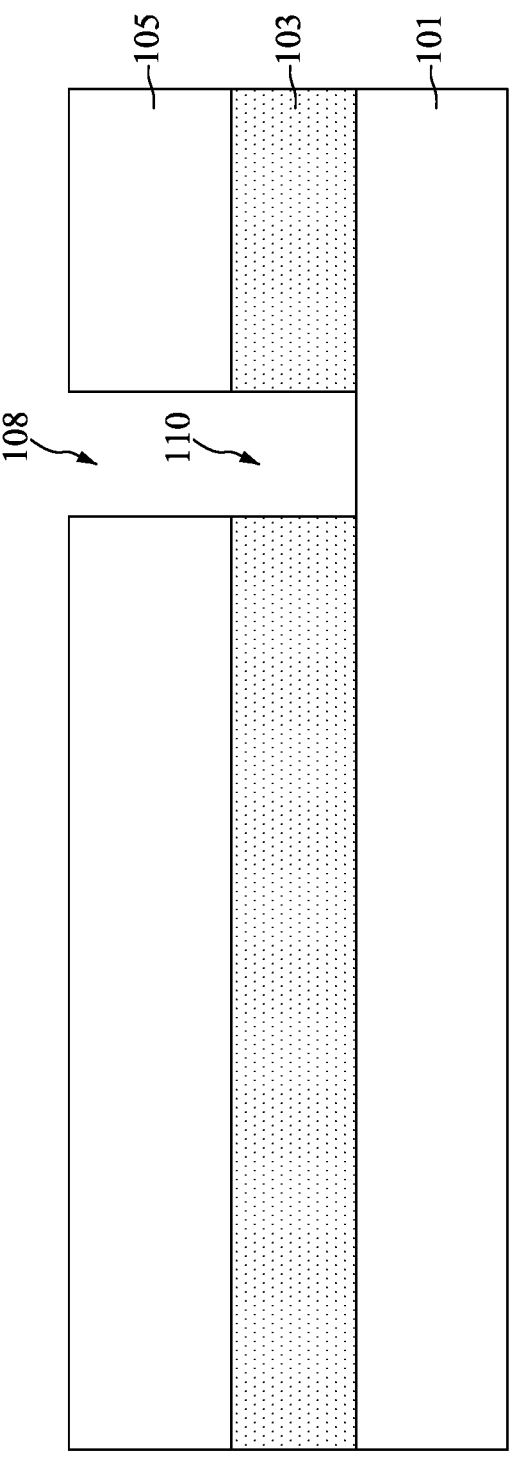
FIG. 7 is a cross-sectional view illustrating an intermediate stage of forming an opening in the first dielectric layer during the formation of the semiconductor device structure, in accordance with some embodiments.

Next, an etching process is performed on the first dielectric layer 103 using the patterned mask 105 as a mask, such that an opening 110 is formed in the first dielectric layer 103, as shown in FIG. 7 in accordance with some embodiments. In some embodiments, the opening 110 penetrates through the first dielectric layer 103, such that the semiconductor substrate 101 is partially exposed. The etching process may be a wet etching process, a dry etching process, or a combination thereof.

Figure 8:
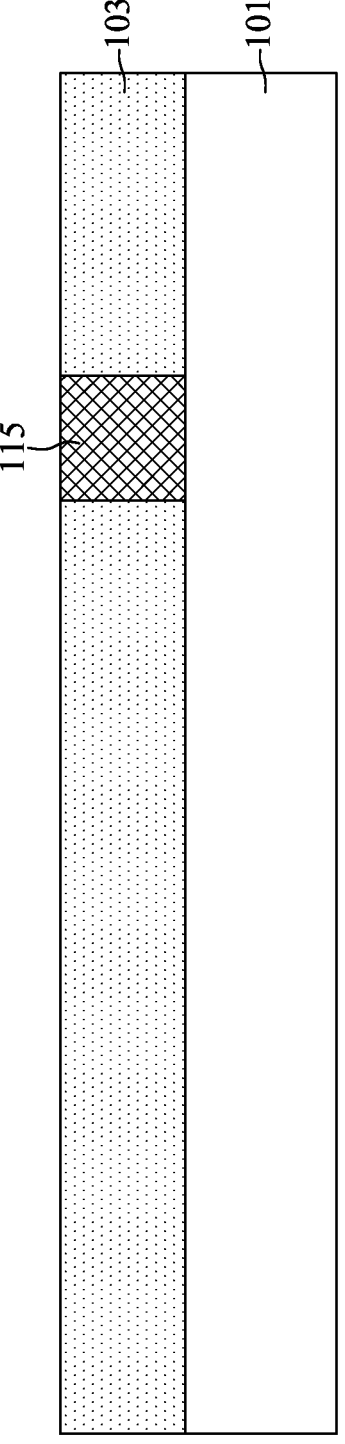
FIG. 8 is a cross-sectional view illustrating an intermediate stage of filling the opening in the first dielectric layer with a first energy removable structure during the formation of the semiconductor device structure, in accordance with some embodiments.

Subsequently, the opening 110 in the first dielectric layer 103 is filled by a first energy removable structure 115, as shown in FIG. 8 in accordance with some embodiments. The respective step is illustrated as the step S13 in the method 10 shown in FIG. 4. In some embodiments, the formation of the first energy removable structure 115 includes conformally depositing an energy removable material (not shown) in the opening 110 and over the first dielectric layer 103, and planarizing the energy removable material to expose the first dielectric layer 103. The patterned mask 105 may be removed before the energy removable material is deposited, or after the energy removable material is deposited (i.e., remove the patterned mask 105 with the excess energy removable material outside the opening 110 by the planarization process).

In some embodiments, the energy removable material for forming the first energy removable structure 115 includes a thermal decomposable material. In some other embodiments, the energy removable material includes a photonic decomposable material, an e-beam decomposable material, or another suitable energy decomposable material. In some embodiments, the energy removable material includes a base material and a decomposable porogen material that is substantially removed once being exposed to an energy source (e.g., heat). In this case, the base material may include hydrogen silsesquioxane (HSQ), methylsilsesquioxane (MSQ), porous polyarylether (PAE), porous SiLK, or porous silicon oxide ($SiO_2$), and the decomposable porogen material may include a porogen organic compound, which can provide porosity to the space originally occupied by the first energy removable structure 115 in the subsequent processes.

In addition, the depositing of the energy removable material may include a CVD process, a PVD process, an ALD process, a spin-on coating process, or another suitable process, and the planarization process for forming the first energy removable structure 115 may include a chemical mechanical polishing (CMP) process, an etch-back process, or another suitable process. After the planarization process is performed, the first dielectric layer 103 is exposed, and the top surface of the first energy removable structure 115 is substantially coplanar with the top surface of the first dielectric layer 103, in accordance with some embodiments.

Figure 9:
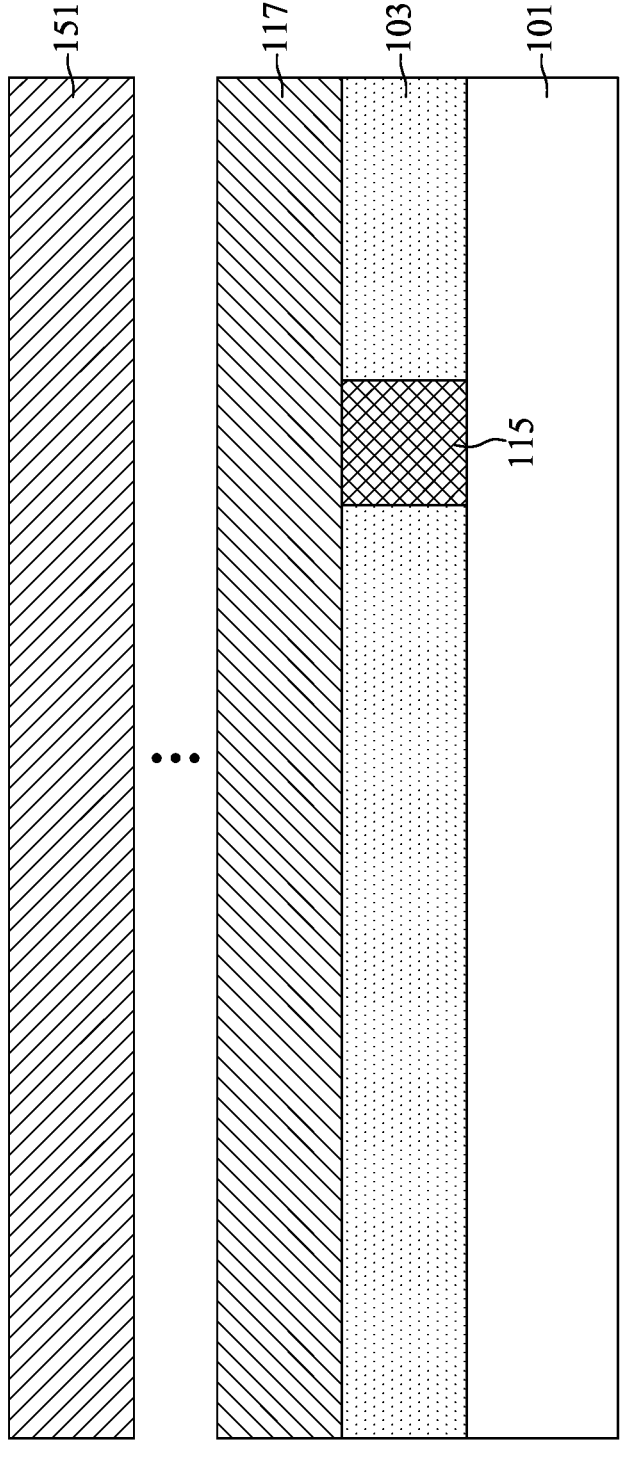
FIG. 9 is a cross-sectional view illustrating an intermediate stage of sequentially forming a plurality of dielectric layers over the first dielectric layer during the formation of the semiconductor device structure, the plurality of dielectric layers includes a second dielectric layer and an $N^{th}$ dielectric layer over the second dielectric layer, and the N is an integer greater than 2, in accordance with some embodiments.

Then, a plurality of dielectric layers including a second dielectric layer 117 to an $N^{th}$ dielectric layer 151 are formed over the first dielectric layer 103 and covering the first energy removable structure 115, as shown in FIG. 9 in accordance with some embodiments. In some embodiments, the N is an integer greater than 2. The respective step is illustrated as the steps S15 and S17 in the method 10 shown in FIG. 4. Some materials and processes used to form the second dielectric layer 117 to the $N^{th}$ dielectric layer 151 are similar to, or the same as, those used to form the first dielectric layer 103, and details thereof are not repeated herein.

Figure 10:
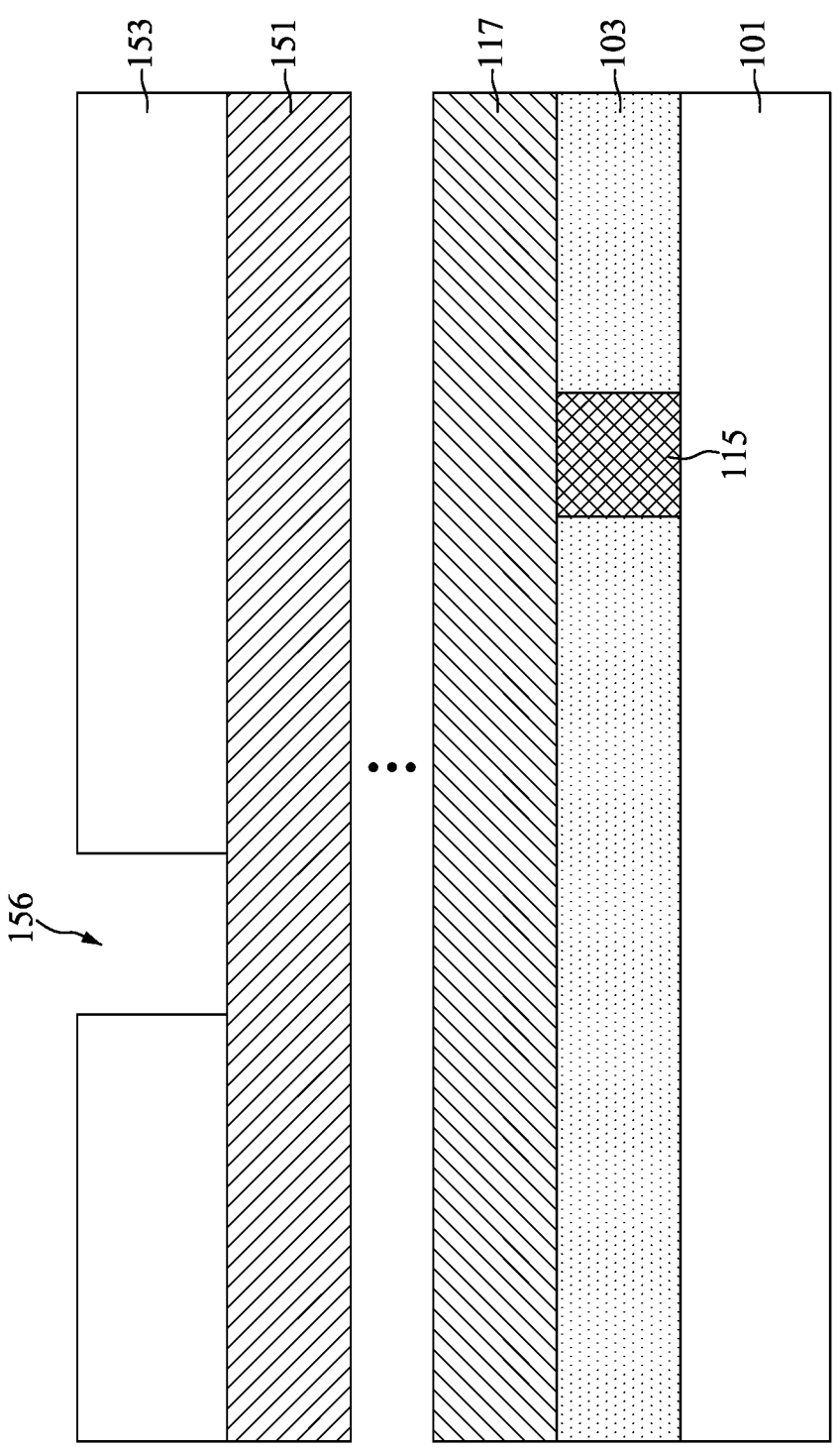
FIG. 10 is a cross-sectional view illustrating an intermediate stage of forming a patterned mask over the $N^{th}$ dielectric layer during the formation of the semiconductor device structure, in accordance with some embodiments.

Next, a patterned mask 153 with an opening 156 is formed over the $N^{th}$ dielectric layer 151, as shown in FIG. 10 in accordance with some embodiments. In some embodiments, the $N^{th}$ dielectric layer 151 is partially exposed by the opening 156. In some embodiments, the opening 156 and the first energy removable structure 115 are not overlapped from the top view. In some embodiments, the $N^{th}$ dielectric layer 151 and the patterned mask 153 include different materials so that the etching selectivities may be different in the subsequent etching process.

Figure 11:
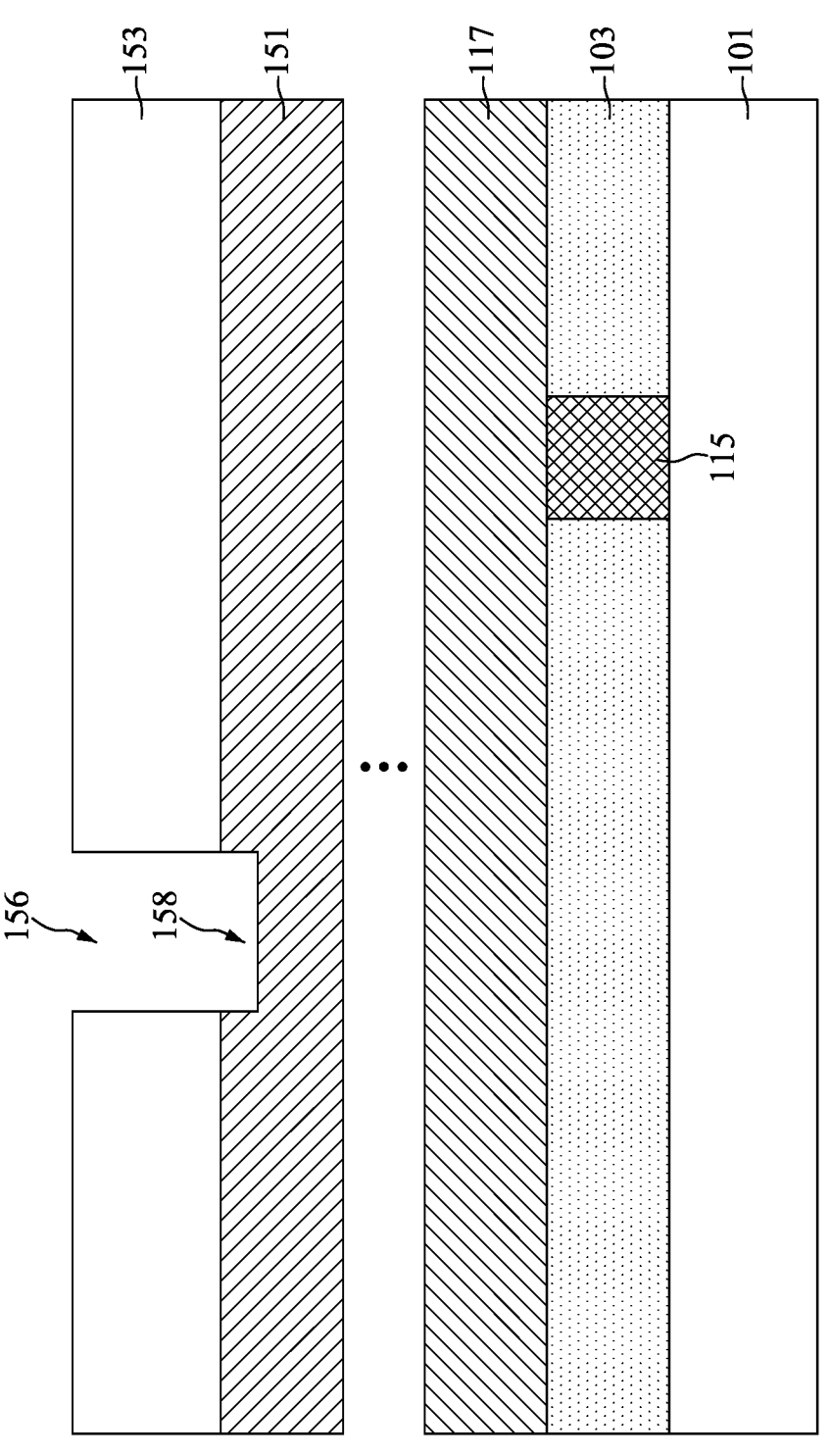
FIG. 11 is a cross-sectional view illustrating an intermediate stage of forming a recess in the $N^{th}$ dielectric layer using the patterned mask as a mask during the formation of the semiconductor device structure, in accordance with some embodiments.

Subsequently, an etching process is performed on the $N^{th}$ dielectric layer 151 using the patterned mask 153 as a mask, such that a recess 158 is formed in the $N^{th}$ dielectric layer 151, as shown in FIG. 11 in accordance with some embodiments. In some embodiments, the recess 158 does not penetrate through the $N^{th}$ dielectric layer 151. The etching process may be a wet etching process, a dry etching process, or a combination thereof.

Figure 12:
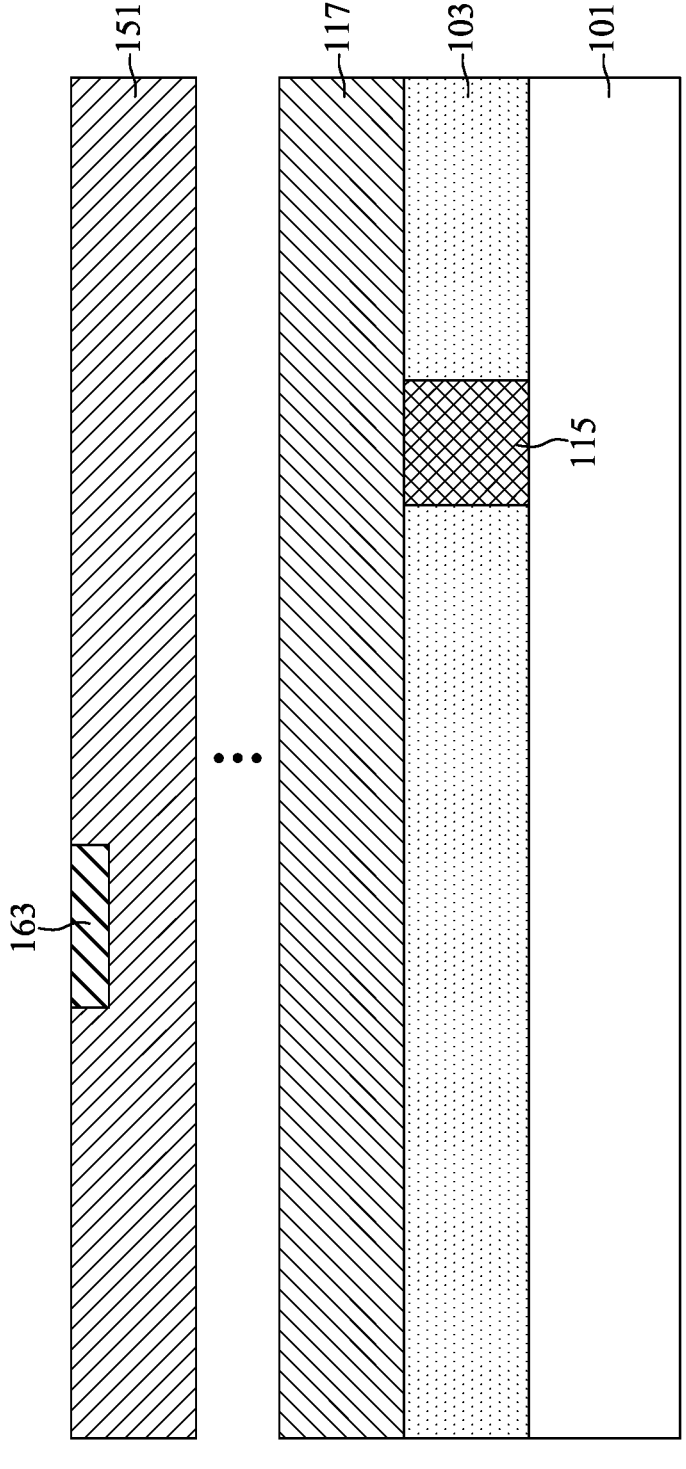
FIG. 12 is a cross-sectional view illustrating an intermediate stage of filling the recess in the $N^{th}$ dielectric layer with a first conductor, and removing the patterned mask during the formation of the semiconductor device structure, in accordance with some embodiments.

Then, the recess 158 in the $N^{th}$ dielectric layer 151 is filled by a first conductor 163, as shown in FIG. 12 in accordance with some embodiments. The respective step is illustrated as the step S19 in the method 10 shown in FIG. 4. In some embodiments, the formation of the first conductor 163 includes conformally depositing a conductive material (not shown) in the recess 158 and over the $N^{th}$ dielectric layer 151, and planarizing the conductive material to expose the $N^{th}$ dielectric layer 151. The patterned mask 153 may be removed before the conductive material is deposited, or after the conductive material is deposited (i.e., remove the patterned mask 153 with the excess conductive material outside the recess 158 by the planarization process).

In some embodiments, the conductive material for forming the first conductor 163 includes copper (Cu), aluminum (Al), tungsten (W), titanium (Ti), tantalum (Ta), gold (Au), silver (Ag), a combination thereof, or another suitable conductive material. Moreover, the conductive material for forming the first conductor 163 may be deposited by a CVD process, a PVD process, an ALD process, a metal organic chemical vapor deposition (MOCVD) process, a sputtering process, a plating process, or another suitable process, and the planarization process for forming the first conductor 163 may include a CMP process, an etch-back process, or another suitable process. After the planarization process is performed, the $N^{th}$ dielectric layer 151 is exposed, and the top surface of the first conductor 163 is substantially coplanar with the top surface of the $N^{th}$ dielectric layer 151, in accordance with some embodiments.

Figure 13:
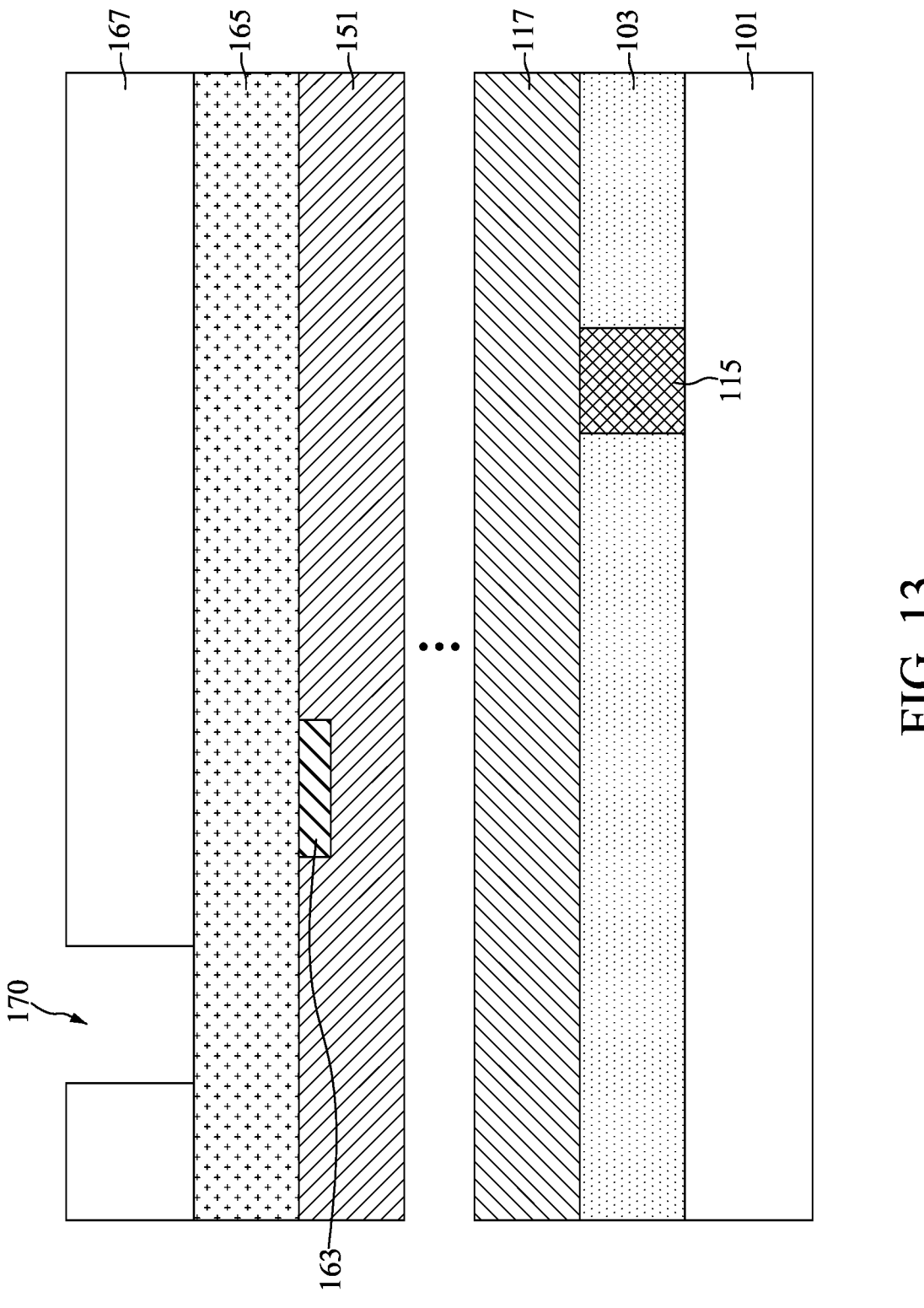
FIG. 13 is a cross-sectional view illustrating an intermediate stage of forming an $(N+1)^{th}$ dielectric layer over the $N^{th}$ dielectric layer and covering the first conductor during the formation of the semiconductor device structure, in accordance with some embodiments.

Next, an $(N+1)^{th}$ dielectric layer 165 is formed over the $N^{th}$ dielectric layer 151 and covering the first conductor 163, as shown in FIG. 13 in accordance with some embodiments. The respective step is illustrated as the step S21 in the method 10 shown in FIG. 4. Some materials and processes used to form the $(N+1)^{th}$ dielectric layer 165 are similar to, or the same as, those used to form the first dielectric layer 103, and details thereof are not repeated herein.

Moreover, a patterned mask 167 with an opening 170 is formed over the $(N+1)^{th}$ dielectric layer 165, in accordance with some embodiments. In some embodiments, the $(N+1)^{th}$ dielectric layer 165 is partially exposed by the opening 170. In some embodiments, the opening 170 and the first energy removable structure 115 are not overlapped from the top view. In some embodiments, the $(N+1)^{th}$ dielectric layer 165 and the patterned mask 167 include different materials so that the etching selectivities may be different in the subsequent etching process.

Figure 14:
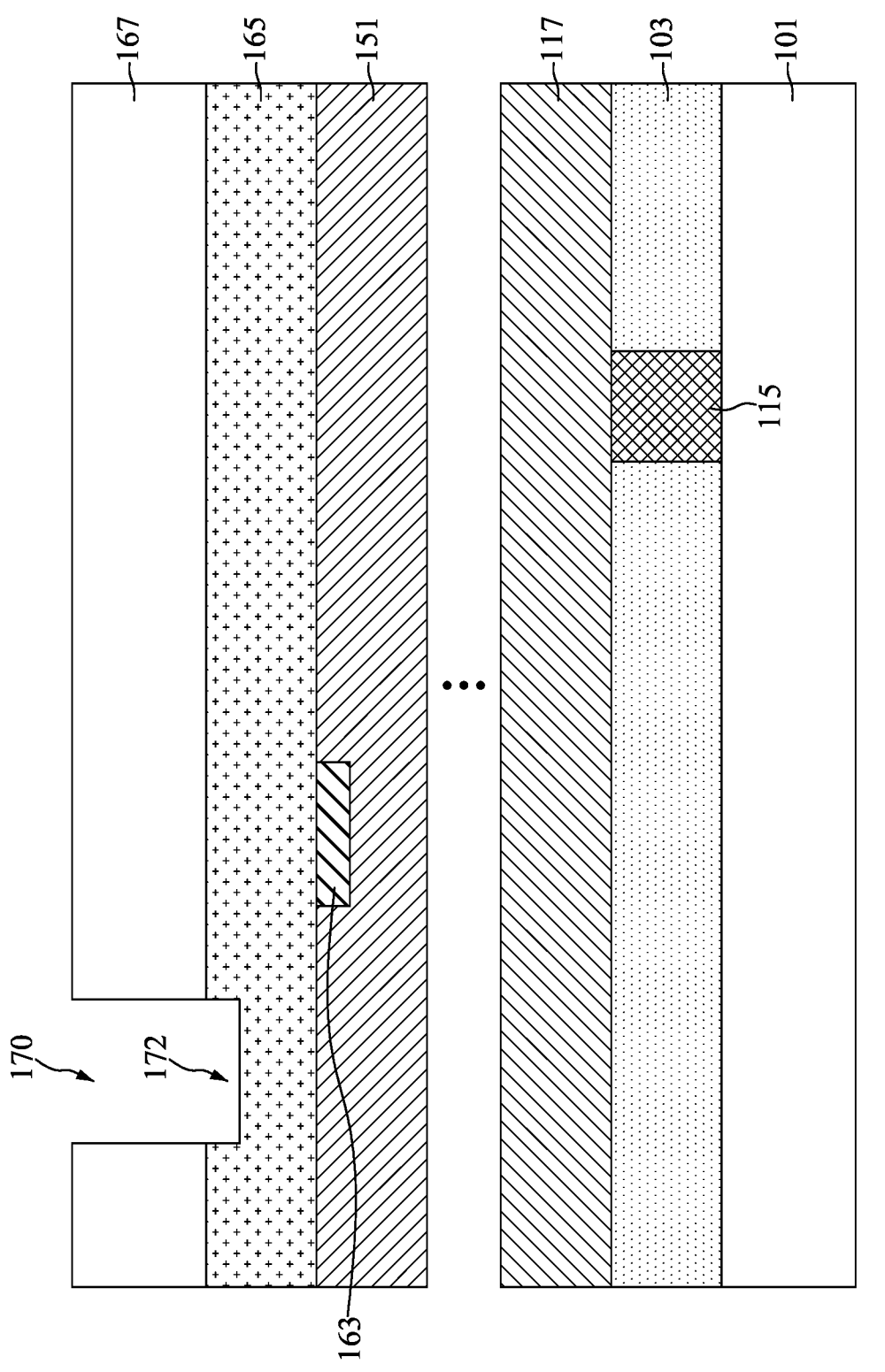
FIG. 14 is a cross-sectional view illustrating an intermediate stage of forming a recess in the $(N+1)^{th}$ dielectric layer during the formation of the semiconductor device structure, in accordance with some embodiments.

Subsequently, an etching process is performed on the $(N+1)^{th}$ dielectric layer 165 using the patterned mask 167 as a mask, such that a recess 172 is formed in the $(N+1)^{th}$ dielectric layer 165, as shown in FIG. 14 in accordance with some embodiments. In some embodiments, the recess 172 does not penetrate through the $(N+1)^{th}$ dielectric layer 165. The etching process may be a wet etching process, a dry etching process, or a combination thereof.

Figure 15:
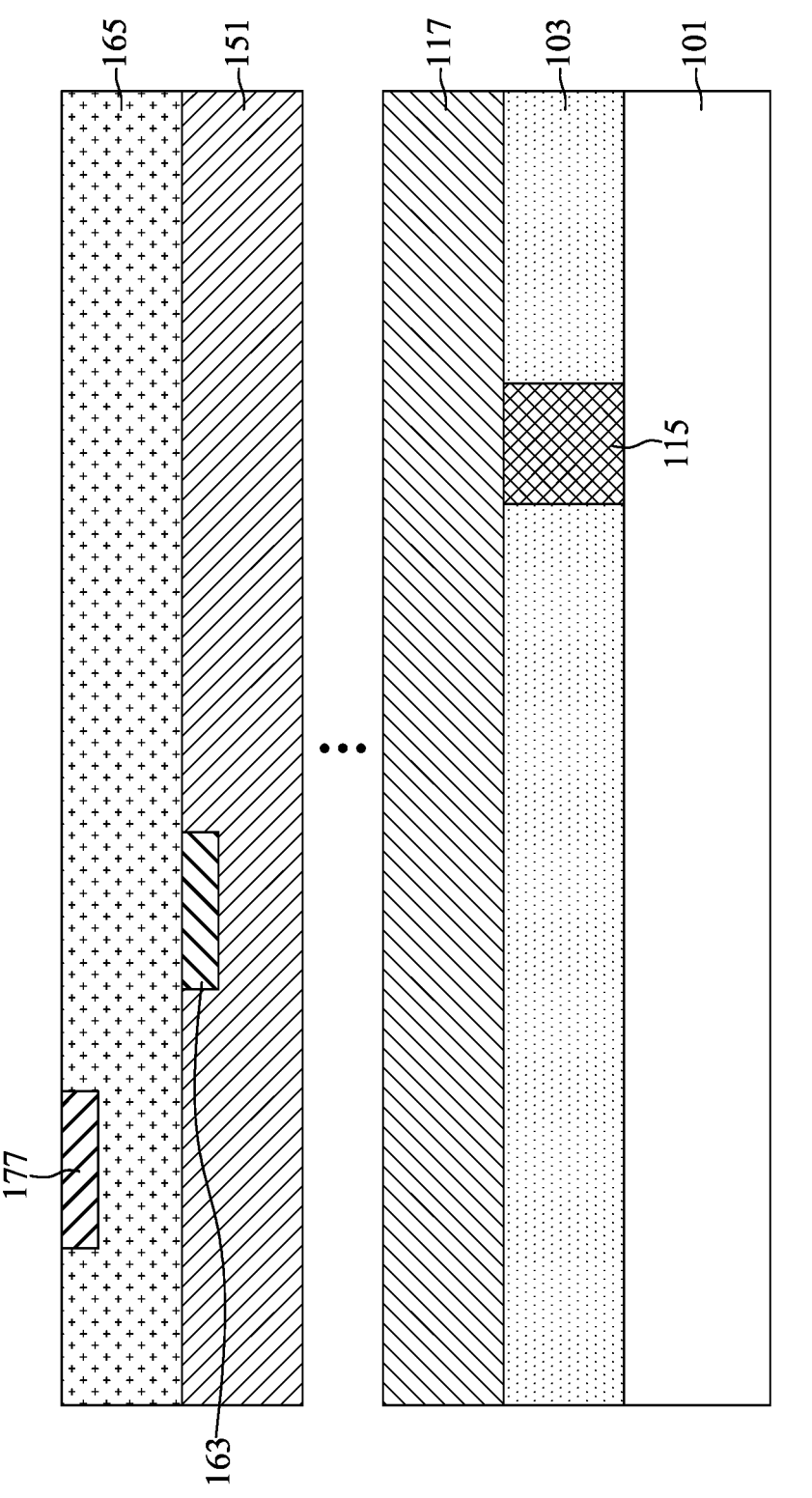
FIG. 15 is a cross-sectional view illustrating an intermediate stage of filling the recess in the $(N+1)^{th}$ dielectric layer with a second conductor during the formation of the semiconductor device structure, in accordance with some embodiments.

Then, the recess 172 in the $(N+1)^{th}$ dielectric layer 165 is filled by a second conductor 177, as shown in FIG. 15 in accordance with some embodiments. The respective step is illustrated as the step S23 in the method 10 shown in FIG. 4. In some embodiments, the formation of the second conductor 177 includes conformally depositing a conductive material (not shown) in the recess 172 and over the $(N+1)^{th}$ dielectric layer 165, and planarizing the conductive material to expose the $(N+1)^{th}$ dielectric layer 165. The patterned mask 167 may be removed before the conductive material is deposited, or after the conductive material is deposited (i.e., remove the patterned mask 167 with the excess conductive material outside the recess 172 by the planarization process).

Some materials and processes used to form the second conductor 177 are similar to, or the same as, those used to form the first conductor 163, and details thereof are not repeated herein. After the second conductor 177 is formed, the top surface of the second conductor 177 is substantially coplanar with the top surface of the $(N+1)^{th}$ dielectric layer 165, in accordance with some embodiments.

Figure 16:
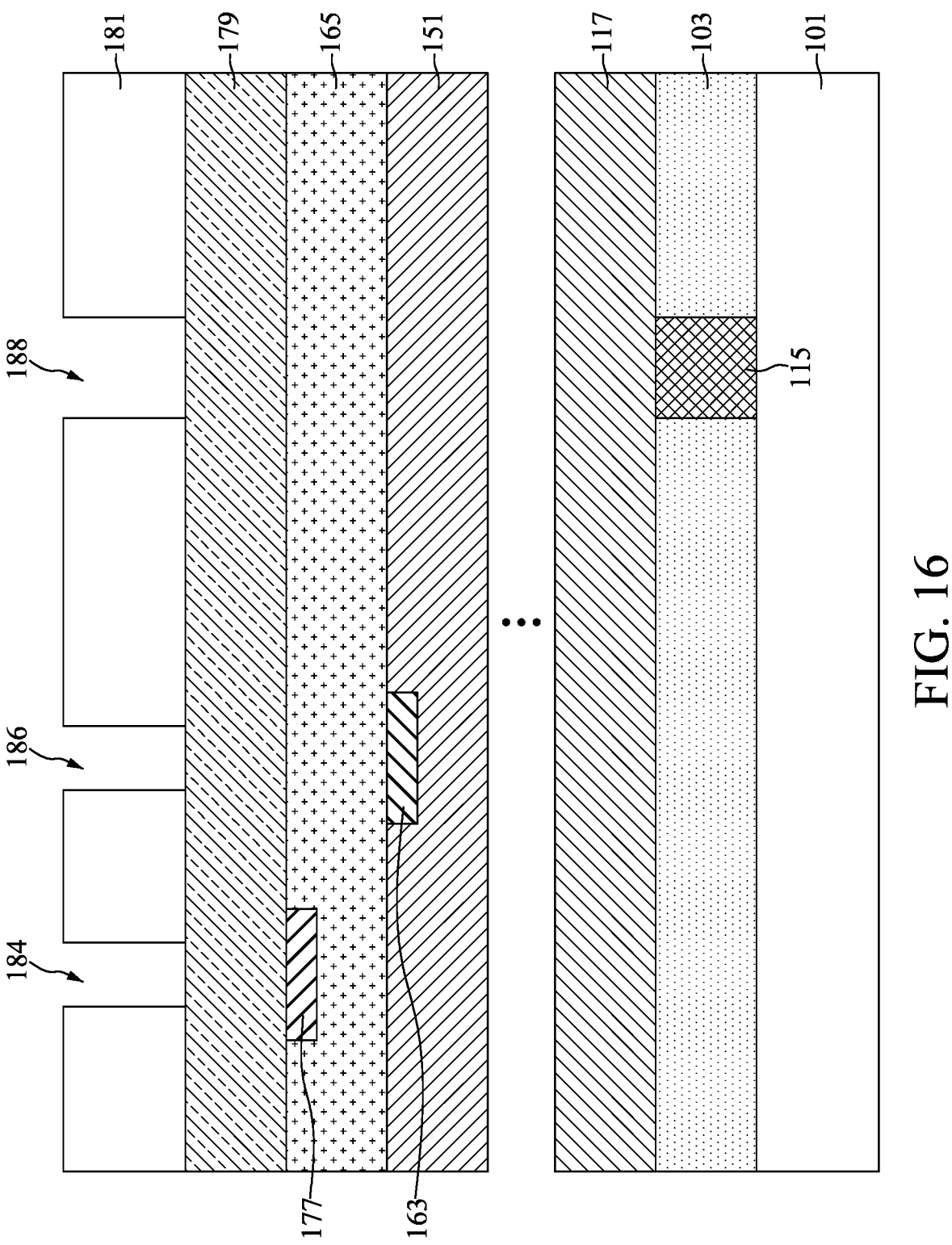

Next, an $(N+2)^{th}$ dielectric layer 179 is formed over the $(N+1)^{th}$ dielectric layer 165 and covering the second conductor 177, as shown in FIG. 16 in accordance with some embodiments. The respective step is illustrated as the step S25 in the method 10 shown in FIG. 4. Some materials and processes used to form the $(N+2)^{th}$ dielectric layer 179 are similar to, or the same as, those used to form the first dielectric layer 103, and details thereof are not repeated herein.

Moreover, a patterned mask 181 with openings 184, 186, and 188 is formed over the $(N+2)^{th}$ dielectric layer 179, in accordance with some embodiments. In some embodiments, the $(N+2)^{th}$ dielectric layer 179 is partially exposed by the openings 184, 186, and 188. In some embodiments, the opening 184 and the second conductor 177 are overlapped from the top view, the opening 186 and the first conductor 163 are overlapped from the top view, and the opening 188 and the first energy removable structure 115 are overlapped from the top view. In some embodiments, the $(N+2)^{th}$ dielectric layer 179 and the patterned mask 181 include different materials so that the etching selectivities may be different in the subsequent etching process.

Subsequently, an etching process is performed on the structure using the patterned mask 181 as a mask, such that openings 190, 192, and 194 are formed, as shown in FIG. 17 in accordance with some embodiments. In some embodiments, the first energy removable structure 115, the first conductor 163, and the second conductor 177 are used as etch stops for the etching process, such that the first energy removable structure 115 is exposed by the opening 194, first conductor 163 is exposed by the opening 192, and the second conductor 177 is exposed by the opening 190. The respective step is illustrated as the step S27 in the method 10 shown in FIG. 4. The etching process may be a wet etching process, a dry etching process, or a combination thereof.

In some embodiments, the top surface S3 of the first energy removable structure 115 is exposed by the opening 194, the top surface S2 of the first conductor 163 is exposed by the opening 192, and the top surface S1 of the second conductor 177 is exposed by the opening 190. The top surface S1 of the second conductor 177 is also referred to as the bottom surface of the opening 190, the top surface S2 of the first conductor 163 is also referred to as the bottom surface of the opening 192, and the top surface S3 of the first energy removable structure 115 is also referred to as the bottom surface of the opening 194. In some embodiments, the bottom surface S1 of the opening 190 is higher than the bottom surface S2 of the opening 192, and the bottom surface S2 of the opening 192 is higher than the bottom surface S3 of the opening 194. It should be noted that the openings 190, 192, and 194 are formed by the same etching process.

After the etching process for forming the openings 190, 192, and 194 are performed, the patterned mask 181 is removed, as shown in FIG. 1 in accordance with some embodiments. In some embodiments, the patterned mask 181 is removed by a stripping process, an ashing process, an etching process, or another suitable process. Then, as mentioned above, the first energy removable structure 115 is removed, as shown in FIG. 3 in accordance with some embodiments. The respective step is illustrated as the step S29 in the method 10 shown in FIG. 4. Details regarding the removal of the first energy removable structure 115 are the same as those previously described, and the details are not repeated herein.

FIGS. 18-22 are cross-sectional views illustrating intermediate stages of forming the semiconductor device structure 100*b*, in accordance with some embodiments. It should be pointed out that operations for forming the semiconductor device structure 100*b* before the structure shown in FIG. 18 are substantially the same as the operations for forming the semiconductor device structure 100*a* shown in FIGS. 6-8 (The steps S31 and S33 in the method 30 shown in FIG. 5 is the same as the steps S11 and S13 in the method 10 shown in FIG. 4), and the related detailed descriptions may refer to the foregoing paragraphs and are not discussed again herein.

After the first energy removable structure 115 is formed in the first dielectric layer 103, a second dielectric layer 117 is formed over the first dielectric layer 103 and covering the first energy removable structure 115, as shown in FIG. 18 in accordance with some embodiments. The respective step is illustrated as the step S35 in the method 30 shown in FIG. 5. The details for forming second dielectric layer 117 may be similar to, or the same as, those for forming second dielectric layer 117 shown in FIG. 9 and are not repeated herein.

Moreover, a patterned mask 119 with an opening 122 is formed over the second dielectric layer 117, in accordance with some embodiments. In some embodiments, the second dielectric layer 117 is partially exposed by the opening 122. In some embodiments, the opening 122 and the first energy removable structure 115 are overlapped from the top view. In some embodiments, the opening 122 is substantially aligned with the first energy removable structure 115. In some embodiments, the second dielectric layer 117 and the patterned mask 119 include different materials so that the etching selectivities may be different in the subsequent etching process.

Then, an etching process is performed on the second dielectric layer 117 using the patterned mask 119 as a mask, such that an opening 124 is formed in the second dielectric layer 117, as shown in FIG. 19 in accordance with some embodiments. In some embodiments, the opening 124 penetrates through the second dielectric layer 117, such that the top surface S3 of the first energy removable structure 115 is exposed. The etching process may be a wet etching process, a dry etching process, or a combination thereof.

Next, the opening 124 in the second dielectric layer 117 is filled by a second energy removable structure 129, as shown in FIG. 20 in accordance with some embodiments. The respective step is illustrated as the step S37 in the method 30 shown in FIG. 5. In some embodiments, the formation of the second energy removable structure 129 includes conformally depositing an energy removable material (not shown) in the opening 124 and over the second dielectric layer 117, and planarizing the energy removable material to expose the second dielectric layer 117. The patterned mask 119 may be removed before the energy removable material is deposited, or after the energy removable material is deposited (i.e., remove the patterned mask

119 with the excess energy removable material outside the opening 124 by the planarization process).

Some materials and processes used to form the second energy removable structure 129 are similar to, or the same as, those used to form the first energy removable structure 115, and details thereof are not repeated herein. After the planarization process is performed, the second dielectric layer 117 is exposed, and the top surface of the second energy removable structure 129 is substantially coplanar with the top surface of the second dielectric layer 117, in accordance with some embodiments.

Subsequently, a plurality of dielectric layers including an $N^{th}$ dielectric layer 151, an $(N+1)^{th}$ dielectric layer 165, and an $(N+2)^{th}$ dielectric layer 179 are formed over the second dielectric layer 117 and covering the second energy removable structure 129, a first conductor 163 is formed in the $N^{th}$ dielectric layer 151, and a second conductor 177 is formed in the $(N+1)^{th}$ dielectric layer 165, as shown in FIG. 21 in accordance with some embodiments. In some embodiments, the N is an integer greater than 2. The respective steps are illustrated as the steps S39 to S47 in the method 30 shown in FIG. 5. After the $(N+2)^{th}$ dielectric layer 179 is formed, a patterned mask 181 with openings 184, 186, and 188 is formed to partially expose the $(N+2)^{th}$ dielectric layer 179, in accordance with some embodiments.

The details for forming $N^{th}$ dielectric layer 151, $(N+1)^{th}$ dielectric layer 165, $(N+2)^{th}$ dielectric layer 179, first conductor 163, second conductor 177, and patterned mask 181 may be similar to, or the same as, those for forming $N^{th}$ dielectric layer 151, $(N+1)^{th}$ dielectric layer 165, $(N+2)^{th}$ dielectric layer 179, first conductor 163, second conductor 177, and patterned mask 181 shown in FIGS. 9-16 and are not repeated herein.

Then, an etching process is performed on the structure using the patterned mask 181 as a mask, such that openings 190, 192, and 196 are formed, as shown in FIG. 22 in accordance with some embodiments. In some embodiments, the second energy removable structure 129, the first conductor 163, and the second conductor 177 are used as etch stops for the etching process, such that the second energy removable structure 129 is exposed by the opening 196, the first conductor 163 is exposed by the opening 192, and the second conductor 177 is exposed by the opening 190. The respective step is illustrated as the step S49 in the method 30 shown in FIG. 5. The etching process may be a wet etching process, a dry etching process, or a combination thereof.

In some embodiments, the top surface S4 of the second energy removable structure 129 is exposed by the opening 196, the top surface S2 of the first conductor 163 is exposed by the opening 192, and the top surface S1 of the second conductor 177 is exposed by the opening 190. The top surface S1 of the second conductor 177 is also referred to as the bottom surface of the opening 190, the top surface S2 of the first conductor 163 is also referred to as the bottom surface of the opening 192, and the top surface S4 of the second energy removable structure 129 is also referred to as the bottom surface of the opening 196. In some embodiments, the bottom surface S1 of the opening 190 is higher than the bottom surface S2 of the opening 192, and the bottom surface S2 of the opening 192 is higher than the bottom surface S4 of the opening 196. It should be noted that the openings 190, 192, and 196 are formed by the same etching process.

After the etching process for forming the openings 190, 192, and 196 are performed, the patterned mask 181 is removed, as shown in FIG. 2 in accordance with some embodiments. In some embodiments, the patterned mask

181 is removed by a stripping process, an ashing process, an etching process, or another suitable process. Then, as mentioned above, the first energy removable structure 115 and the second energy removable structure 129 are removed, as shown in FIG. 3 in accordance with some embodiments. The respective step is illustrated as the step S51 in the method 30 shown in FIG. 5. Details regarding the removal of the first energy removable structure 115 and the second energy removable structure 129 are the same as those previously described, and the details are not repeated herein.

Embodiments of the semiconductor device structure and method for preparing the same are provided in the disclosure. In some embodiments, the semiconductor device structure includes multiple stacked dielectric layers, that is, from the first dielectric layer 103, the second dielectric layer 117 to the N$^{th}$ dielectric layer 151, the (N+1)$^{th}$ dielectric layer 165, and the (N+2)$^{th}$ dielectric layer 179. In some embodiments, the semiconductor device structure also includes a conductor (e.g., the first conductor 163) and an energy removable structure (e.g., the first energy removable structure 115) disposed in different levels of the dielectric layers.

An etching process is performed to form an opening exposing the conductor (e.g., the opening 192) and another opening exposing the energy removable structure (e.g., the opening 194), the opening exposing the energy removable structure has an aspect ratio higher than that of the opening exposing the conductor, and both of the conductor and the energy removable structure are used as etch stops for the etching process. After the etching process is performed, the energy removable structure can be easily removed. By using the energy removable structure as an etch stop for forming the opening with a higher aspect ratio, the aspect ratio difference between the openings can be reduced (compared to the case where the energy removable structure is not formed). As a result, the etching process for forming the openings with different aspect ratios can be performed easily, and the performance, reliability and yield of the semiconductor device structure can be improved.

In one embodiment of the present disclosure, a semiconductor device structure is provided. The semiconductor device structure includes a first dielectric layer disposed over a semiconductor substrate, and a first energy removable structure disposed in the first dielectric layer. The semiconductor device structure also includes a second dielectric layer disposed over the first dielectric layer, and an N$^{th}$ dielectric layer disposed over the second dielectric layer. The N is an integer greater than 2. The semiconductor device structure further includes a first conductor disposed in the N$^{th}$ dielectric layer, and an (N+1)$^{th}$ dielectric layer disposed over the N$^{th}$ dielectric layer. A top surface of the first conductor is exposed by a first opening, and a top surface of the first energy removable structure is exposed by a second opening.

In another embodiment of the present disclosure, a semiconductor device structure is provided. The semiconductor device structure includes a first dielectric layer disposed over a semiconductor substrate, and a first energy removable structure disposed in the first dielectric layer. The semiconductor device structure also includes a second dielectric layer disposed over the first dielectric layer, and a second energy removable structure disposed in the second dielectric layer. The semiconductor device structure further includes an N$^{th}$ dielectric layer disposed over the second dielectric layer. The N is an integer greater than 2. In addition, the semiconductor device structure includes a first conductor disposed in the N$^{th}$ dielectric layer, and an (N+1)$^{th}$ dielectric layer disposed over the N$^{th}$ dielectric layer. A top surface of the first conductor is exposed by a first opening, and a top surface of the second energy removable structure is exposed by a second opening.

In yet another embodiment of the present disclosure, a method for preparing a semiconductor device structure is provided. The method includes forming a first dielectric layer over a semiconductor substrate, and forming a first energy removable structure in the first dielectric layer. The method also includes forming a second dielectric layer over the first dielectric layer and covering the first energy removable structure, and forming an N$^{th}$ dielectric layer over the second dielectric layer. The N is an integer greater than 2. The method further includes forming a first conductor in the N$^{th}$ dielectric layer, and forming an (N+1)$^{th}$ dielectric layer over the N$^{th}$ dielectric layer and covering the first conductor. In addition, the method includes performing an etching process to form a first opening exposing the first conductor and a second opening directly over the first energy removable structure. A bottom surface of the first opening is higher than a bottom surface of the second opening.

The embodiments of the present disclosure have some advantageous features. In some embodiment, the semiconductor device structure includes multiple stacked dielectric layers, and a conductor and an energy removable structure disposed in different levels of the dielectric layers. An etching process is performed to form a low-aspect-ratio opening exposing the conductor and a high-aspect ratio opening exposing the energy removable structure, and both of the conductor and the energy removable structure are used as etch stops for the etching process. Since the energy removable structure can be easily removed after the etching process, the aspect ratio difference between the two openings can be reduced (compared to the case where the energy removable structure is not formed). As a result, the etching process for forming the openings with different aspect ratios can be performed easily, and the performance, reliability and yield of the semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
   a first dielectric layer disposed on and in direct contact with a top surface of a semiconductor substrate;
   a first energy removable structure disposed in and surrounded by the first dielectric layer and in contact with the top surface of the semiconductor substrate, wherein a top surface of the first energy removable structure is coplanar with a top surface of the first dielectric layer;

a second dielectric layer disposed on and in direct contact with the top surface of the first dielectric layer, wherein the second dielectric layer is positioned above the first energy removable structure;

an $N^{th}$ dielectric layer disposed over the second dielectric layer, wherein the N is an integer greater than 2, wherein the Nth dielectric layer has a first recess indented from a top surface thereof, a first conductor disposed in the first recess of the Nth dielectric layer at a position that a bottom surface of the first conductor is higher than a bottom surface of the Nh dielectric layer; and an $(N+1)^{th}$ dielectric layer disposed over and in contact with the Nth dielectric layer, wherein a top surface of the first conductor is exposed by a first opening, and a top surface of the first energy removable structure is exposed by a second opening;

wherein the first opening is extended through the $(N+1)^{th}$ dielectric layer to expose the top surface of the first conductor, such that the top surface of the first conductor forms a bottom surface of the first opening;

wherein the second opening is extended through the $(N+1)^{th}$ dielectric layer, the $N^{th}$ dielectric layer, and the second dielectric layer to expose the top surface of the first energy removable structure, such that the top surface of the first energy removable structure forms a bottom surface of the second opening;

wherein the top surface of the first conductor is positioned higher than the top surface of the first energy removable structure;

wherein the bottom surface of the first opening is higher than the bottom surface of the second opening, such that a depth of the first opening is less than a depth of the second opening;

wherein the depth of the first opening is a distance between a top surface of the $(N+1)^{th}$ dielectric layer and the top surface of the first conductor;

wherein the depth of the second opening is a distance between the top surface of the $(N+1)^{th}$ dielectric layer and the top surface of the first energy removable structure;

further comprising:

a second conductor disposed in the $(N+1)^{th}$ dielectric layer, wherein the of the $(N+1)^{th}$ dielectric layer has a second recess indented from the top surface thereof, wherein the second conductor disposed in the second recess of the $(N+1)^{th}$ dielectric layer at a position that a bottom surface of the second conductor is higher than a bottom surface of the $(N+1)^{th}$ dielectric layer;

further comprising:

an $(N+2)^{th}$ dielectric layer disposed over the $(N+1)^{th}$ dielectric layer, wherein a top surface of the second conductor is exposed by a third opening;

wherein the third opening is extended through the $(N+2)^{th}$ dielectric layer to expose the top surface of the second conductor, such that the top surface of the second conductor forms a bottom surface of the third opening;

wherein the bottom surface of the third opening is higher than the bottom surface of the first opening, such that a depth of the third opening is less than the depth of the first opening;

wherein the depth of the third opening is a distance between a top surface of the $(N+2)^{th}$ dielectric layer and the top surface of the third conductor;

wherein the depth of the first opening is a distance between a top surface of the $(N+2)^{th}$ dielectric layer and the top surface of the first conductor when the $(N+2)^{th}$ dielectric layer is disposed on the $(N+1)^{th}$ dielectric layer;

wherein the depth of the second opening is a distance between the top surface of the $(N+2)^{th}$ dielectric layer and the top surface of the first energy removable structure when the $(N+2)^{th}$ dielectric layer is disposed on the $(N+1)^{th}$ dielectric layer.

2. The semiconductor device structure of claim 1, wherein the first energy removable structure penetrates through the first dielectric layer.

3. The semiconductor device structure of claim 1, wherein a bottom surface of the first recess to receive the first conductor is higher than the bottom surface of the $N^{th}$ dielectric layer.

4. The semiconductor device structure of claim 1, wherein the first conductor is in direct contact with the $(N+1)^{th}$ dielectric layer, such that the top surface of the first conductor is partially covered by the $(N+1)^{th}$ dielectric layer and is partially exposed through the first opening, wherein a width of the second opening is equal to a width of the first energy removable structure, such that the top surface of the first energy removable structure is entirely exposed through the second opening.

5. The semiconductor device structure of claim 1, wherein a bottom surface of the second recess to receive the second conductor is higher than the bottom surface of the $(N+1)^{th}$ dielectric layer.

6. A semiconductor device structure, comprising:

a first dielectric layer disposed on and in direct contact with a top surface of a semiconductor substrate;

a first energy removable structure disposed in and surrounded by the first dielectric layer and in contact with the semiconductor substrate, wherein a top surface of the first energy removable structure is coplanar with a top surface of the first dielectric layer;

a second dielectric layer disposed on and in direct contact with the top surface of the first dielectric layer, wherein the second dielectric layer is positioned above the first energy removable structure;

a second energy removable structure disposed in the second dielectric layer, wherein a top surface of the first energy removable structure is in contact with a bottom surface of the second energy removable structure, wherein a top surface of the second energy removable structure is coplanar with a top surface of the second dielectric layer;

an $N^{th}$ dielectric layer disposed over the second dielectric layer, wherein the N is an integer greater than 2, wherein the Nth dielectric layer has a first recess indented from a top surface thereof, a first conductor disposed in the first recess of the Nth dielectric layer at a position that a bottom surface of the first conductor is higher than a bottom surface of the Nth dielectric layer; and an $(N+1)^{th}$ dielectric layer disposed over and in contact with the Nth dielectric layer, wherein a top surface of the first conductor is exposed by a first opening, and a top surface of the second energy removable structure is exposed by a second opening;

wherein the top surface of the first conductor is positioned higher than the top surface of the second energy removable structure;

wherein a bottom surface of the first opening is higher than a bottom surface second opening, such that a depth of the first opening is less than a depth of the second opening;

wherein a width of the second opening is equal to a width of the second energy removable structure and is equal to a width of the first energy removable structure, such that the top surface of the second energy removable structure is entirely exposed through the second opening;

further comprising:

a second conductor disposed in the $(N+1)^{th}$ dielectric layer, and a bottom surface of the second conductor is higher than the top surface of the first conductor;

wherein the $(N+1)^{th}$ dielectric layer has a second recess indented from the top surface thereof, wherein the second conductor disposed in the second recess of the $(N+1)^{th}$ dielectric layer at a position that the bottom surface of the second conductor is higher than a bottom surface of the $(N+1)^{th}$ dielectric layer;

further comprising:

an $(N+2)^{th}$ dielectric layer disposed over the $(N+1)^{th}$ dielectric layer, wherein a top surface of the second conductor is exposed by a third opening;

wherein a bottom surface of the third opening is higher than the bottom surface of the first opening, such that a depth of the third opening is less than the depth of the first opening;

wherein the depth of the third opening is a distance between a top surface of the $(N+2)^{th}$ dielectric layer and the top surface of the third conductor;

wherein the depth of the first opening is a distance between a top surface of the $(N+2)^{th}$ dielectric layer and the top surface of the first conductor;

wherein the depth of the second opening is a distance between the top surface of the $(N+2)^{th}$ dielectric layer and the top surface of the first energy removable structure.

7. The semiconductor device structure of claim 6, wherein the second energy removable structure is directly over the first energy removable structure.

8. The semiconductor device structure of claim 6, wherein the second energy removable structure penetrates through the second dielectric layer to directly contact the first energy removable structure.

9. The semiconductor device structure of claim 8, wherein the first energy removable structure penetrates through the first dielectric layer.

10. The semiconductor device structure of claim 6, wherein a bottom surface of the first recess to receive the first conductor is higher than the top surface of the second energy removable structure.

11. The semiconductor device structure of claim 6, wherein the top surface of the first conductor is substantially coplanar with a bottom surface of the $(N+1)^{th}$ dielectric layer.

12. The semiconductor device structure of claim 6, wherein the first energy removable structure and the second energy removable structure are made of a same energy removable material.

13. The semiconductor device structure of claim 6, wherein the first opening is extended through the $(N+1)^{th}$ dielectric layer to expose the top surface of the first conductor, such that the top surface of the first conductor forms the bottom surface of the first opening.

14. The semiconductor device structure of claim 6, wherein the second opening is extended through the $(N+1)^{th}$ dielectric layer, the Nth dielectric layer, and the second dielectric layer to expose the top surface of the second energy removable structure, such that the top surface of the second energy removable structure forms the bottom surface of the second opening.

15. The semiconductor device structure of claim 6, wherein the third opening is extended through the $(N+2)^{th}$ dielectric layer to expose the top surface of the second conductor, such that the top surface of the second conductor forms a bottom surface of the third opening.

* * * * *